US006184709B1

United States Patent
New

(10) Patent No.: US 6,184,709 B1
(45) Date of Patent: Feb. 6, 2001

(54) PROGRAMMABLE LOGIC DEVICE HAVING A COMPOSABLE MEMORY ARRAY OVERLAYING A CLB ARRAY

(75) Inventor: Bernard J. New, Los Gatos, CA (US)

(73) Assignee: Xilinx, Inc., San Jose, CA (US)

(*) Notice: Under 35 U.S.C. 154(b), the term of this patent shall be extended for 0 days.

(21) Appl. No.: 09/105,188

(22) Filed: Jun. 26, 1998

Related U.S. Application Data

(63) Continuation-in-part of application No. 08/631,298, filed on Apr. 9, 1996, now Pat. No. 5,796,269.

(51) Int. Cl.[7] .................................................. H03K 19/177
(52) U.S. Cl. .................................................. 326/40; 326/38
(58) Field of Search .................................. 326/37, 38, 39, 326/40, 41

(56) References Cited

U.S. PATENT DOCUMENTS

| 4,825,414 | 4/1989 | Kawata | 365/189 |
|---|---|---|---|
| 5,042,004 | 8/1991 | Agrawal et al. | 364/900 |
| 5,343,406 | * 8/1994 | Freeman et al. | 364/490 |
| 5,414,377 | 5/1995 | Freidin | 326/41 |
| 5,583,450 | 12/1996 | Trimberger et al. | 326/41 |

OTHER PUBLICATIONS

"XC4000™ Series Advanced Product Information Data Sheet", dated Feb. 2, 1996 available from Xilinx, Inc., 2100 Logic Drive, San Jose, CA 95124.

* cited by examiner

Primary Examiner—Michael Tokar
Assistant Examiner—James H Cho
(74) Attorney, Agent, or Firm—Bever, Hoffman & Harms, LLP; E. Eric Hoffman; Lois D. Cartier

(57) ABSTRACT

A programmable logic device (PLD) which includes a dedicated composable RAM array having a plurality of memory tiles. The PLD also includes an array of CLBs, wherein each of the CLBs in the array is coupled to a corresponding one of the memory tiles. The composable RAM array is accessed through the CLBs. That is, the input signals required by the memory tiles are routed through the corresponding CLBs. Similarly, the output signals provided by the memory tiles are routed out through the corresponding CLBs. Each CLB can be configured to operate as a conventional CLB (i.e., ignore its corresponding memory tile). Alternatively, each CLB can be configured to provide an interface to its corresponding memory tile. To help achieve this, each CLB comprises a set of multiplexers for selectively routing data output signals provided by the corresponding memory tile or output signals provided by the CLB. In addition, each memory tile is capable of being selectively coupled to one or more adjacent memory tiles, thereby allowing the size of the composable RAM array to be selected by the circuit designer. This capability also allows the composable RAM array to be configured to form a plurality of separate and independent memories.

18 Claims, 15 Drawing Sheets

PROGRAMMABLE LOGIC DEVICE HAVING A COMPOSABLE MEMORY ARRAY OVERLAYING A CLB ARRAY

RELATED APPLICATIONS

This application is a continuation-in-part of U.S. patent application Ser. No. 08/631,298 entitled "Composable Memory Array for a Programmable Logic Device and Method for Implementing Same" filed Apr. 9, 1996 now U.S. Pat. No. 5,796,269.

BACKGROUND OF THE INVENTION

This invention relates to a structure and method of implementing a memory array in a programmable logic device.

DESCRIPTION OF THE PRIOR ART

Programmable logic devices (PLDs) typically include an array of configurable logic blocks (CLBs). Each CLB includes logic which is programmed to perform a particular function or functions desired by the user of the PLD. In particular PLDs, such as Xilinx's XC4000™ family of devices, writable RAM-based look-up tables are included in each CLB. The writable RAM-based look-up tables can be used to create a "user-RAM" array. However, such user-RAM arrays are inefficient because creation of the RAM array detracts from the amount of logic available to perform other operations within the PLD. That is, when a CLB is used to create user-RAM array, the logic capacity of the CLB is lost.

Moreover, the RAM arrays which can be conveniently created using the writable RAM-based look-up tables are relatively small (e.g., capable of storing only 16 to 32 bytes). To expand a RAM array (e.g., to more than 16 or 32 bytes), function generators of additional CLBs are required to perform a multiplexing function between the several smaller RAM arrays. As a result, the complexity of the signal routing for the RAM array increases, the amount of logic required by the RAM array increases, and the speed of the RAM array decreases.

For example, when implementing a 256-byte RAM, the CLB area consumed is roughly equivalent to the area of a conventional PLD. While a 256-byte RAM may seem like a large memory to implement using a PLD, such a RAM is still relatively small.

Moreover, the layout area required to make each RAM-based look-up table writable is not an insignificant percentage of the layout area of each CLB. This area penalty is incurred by each CLB, irrespective of whether it is used to create a user-RAM array. The total area penalty for a PLD depends on the size of the PLD and can be equal to the area of 100 or more CLBS.

Accordingly, it would be desirable to have a PLD which implements a user-RAM array and overcomes the problems previously discussed.

SUMMARY OF THE INVENTION

In accordance with one embodiment of the present invention, a PLD (such as an FPGA) includes a dedicated composable RAM array having a plurality of memory tiles. The dedicated memory tiles have a relatively high density when compared with the density of writable RAM-based look-up tables typically present in CLBS. The PLD also includes an array of CLBS, wherein each of the CLBs in the array is coupled to a corresponding one of the memory tiles. The composable RAM array is accessed through the CLBs. That is, the input signals required by the memory tiles are routed through the corresponding CLBS. Similarly, the output signals provided by the memory tiles are routed out through the corresponding CLBs.

Each CLB can be configured to operate as a conventional CLB (i.e., ignore its corresponding memory tile). Alternatively, each CLB can be configured to provide an interface to its corresponding memory tile. To help achieve this, each CLB comprises a set of multiplexers for selectively routing data output signals provided by the corresponding memory tile or output signals provided by the CLB.

In addition, each memory tile is capable of being selectively coupled to one or more adjacent memory tiles, thereby allowing the size of the composable RAM array to be selected by the circuit designer. This capability also allows the composable RAM array to be configured to form a plurality of separate and independent memories.

The present invention will be more fully understood in light of the following detailed description taken together with the drawings.

DETAILED DESCRIPTION

Figure 1:
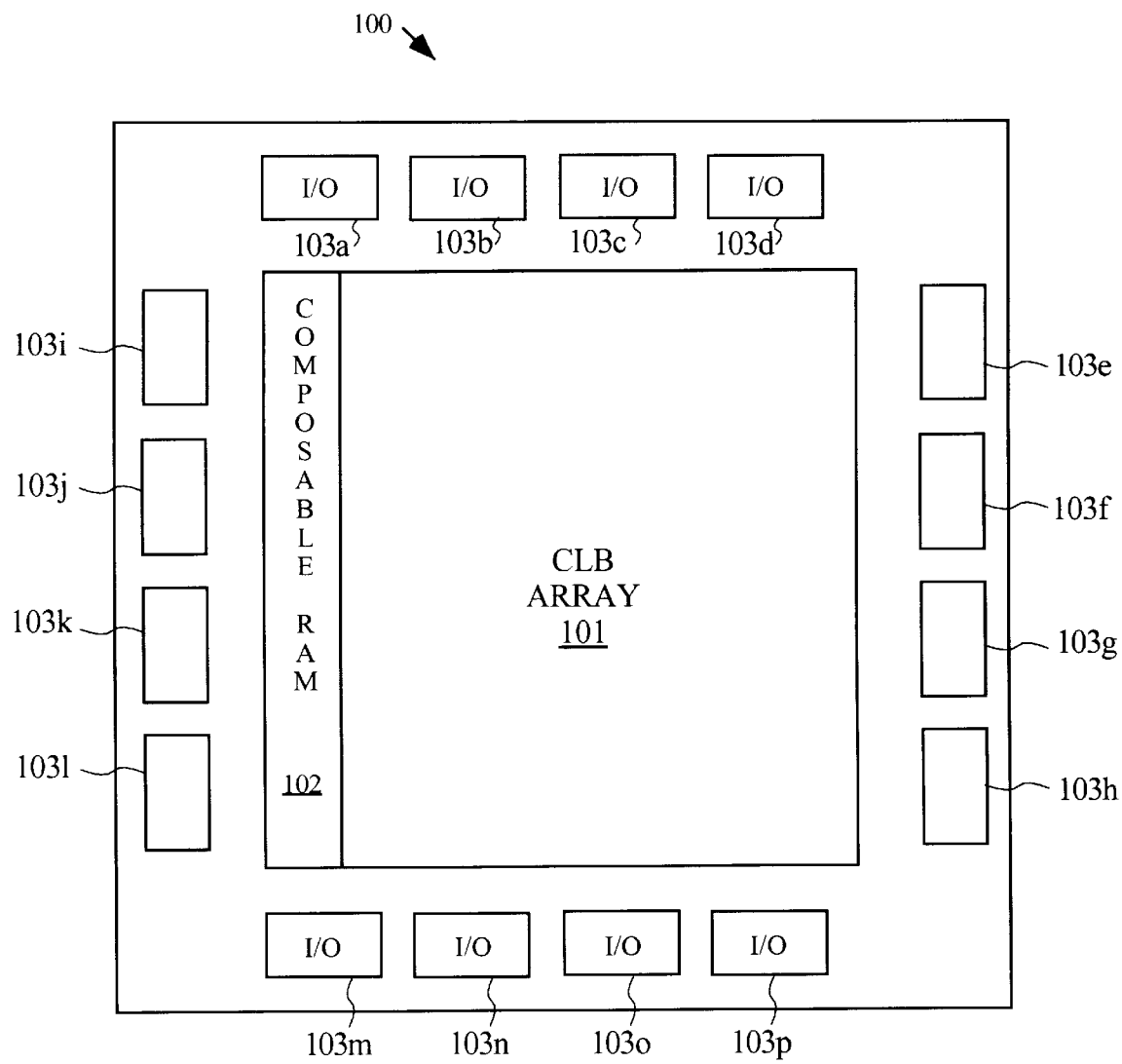
FIG. 1 is a diagram of a PLD in accordance with one embodiment of the present invention.

FIG. 1 is a diagram of a PLD 100 in accordance with one embodiment of the present invention. PLD 100 includes CLB array 101, composable RAM array 102 and input/output (I/O) blocks 103a–103p. CLB array 101 includes a plurality of conventional CLBs which do not include writable RAM-based look-up tables. General information concerning the operation and interaction of a CLB array and I/O blocks is provided in Xilinx's XC4000™ data sheet, which is hereby incorporated by reference in its entirety. Composable RAM array 102 is physically located at a dedicated area on PLD 100 and, in the embodiment illustrated, consumes approximately ⅛th to ⅒th of the area of the logic of PLD 100. In other embodiments, composable RAM array 102 constitutes a higher or lower percentage of the total logic on PLD 100, depending on the particular application of PLD 100. As used herein, the term "composable RAM array" refers to a memory array which is partitionable into one or more smaller memory arrays by the user of the PLD, with each of these smaller memory arrays having a selectable storage capacity. I/O blocks 103a–103p are conventional elements which provide for connections between PLD 100 and circuitry external to PLD 100.

Figure 2:
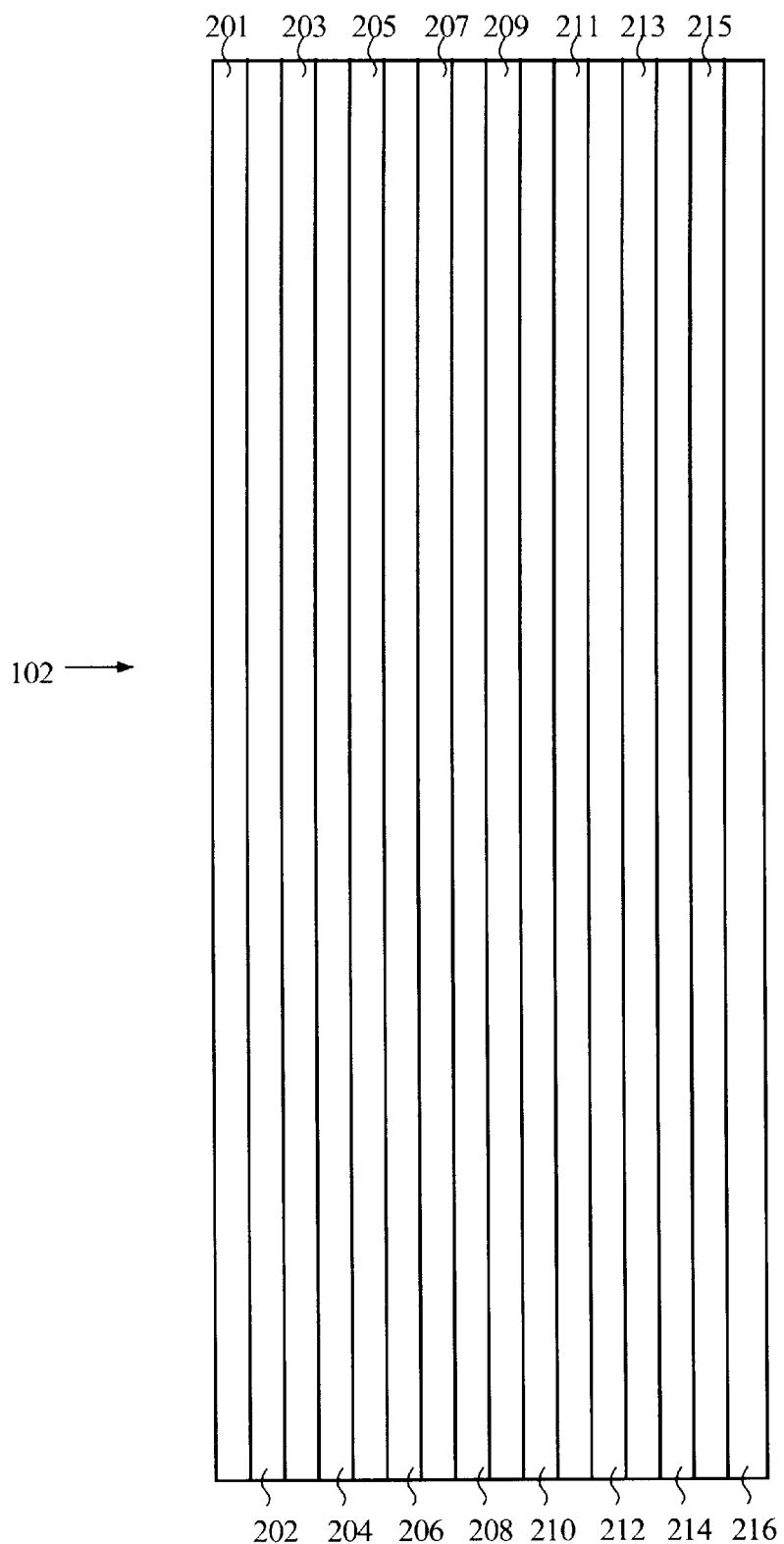
FIG. 2 is a diagram of a composable RAM array which includes a plurality of composable RAM stripes.

FIG. 2 is a diagram of composable RAM array 102, which includes a plurality of composable RAM elements, here called stripes 201–216. Although sixteen composable RAM stripes 201–216 are illustrated in FIG. 2, this number is illustrative and not limiting. In the described embodiment, each of composable RAM stripes 201–216 is capable of storing up to 256 bytes of data, with each byte having 8 bits. Each of composable RAM stripes 201–216 is independent from the other composable RAM stripes. For example, there are no hard-wired connections between RAM stripe 201 and any of the other RAM stripes 202–216. In the illustrated embodiment, composable RAM array 102 has a total capacity of 4096 bytes (256 bytes/stripe×16 stripes). Thus, dedicated composable RAM array 102 provides a relatively large memory capacity without consuming an excessive area of PLD 100.

Figure 3:
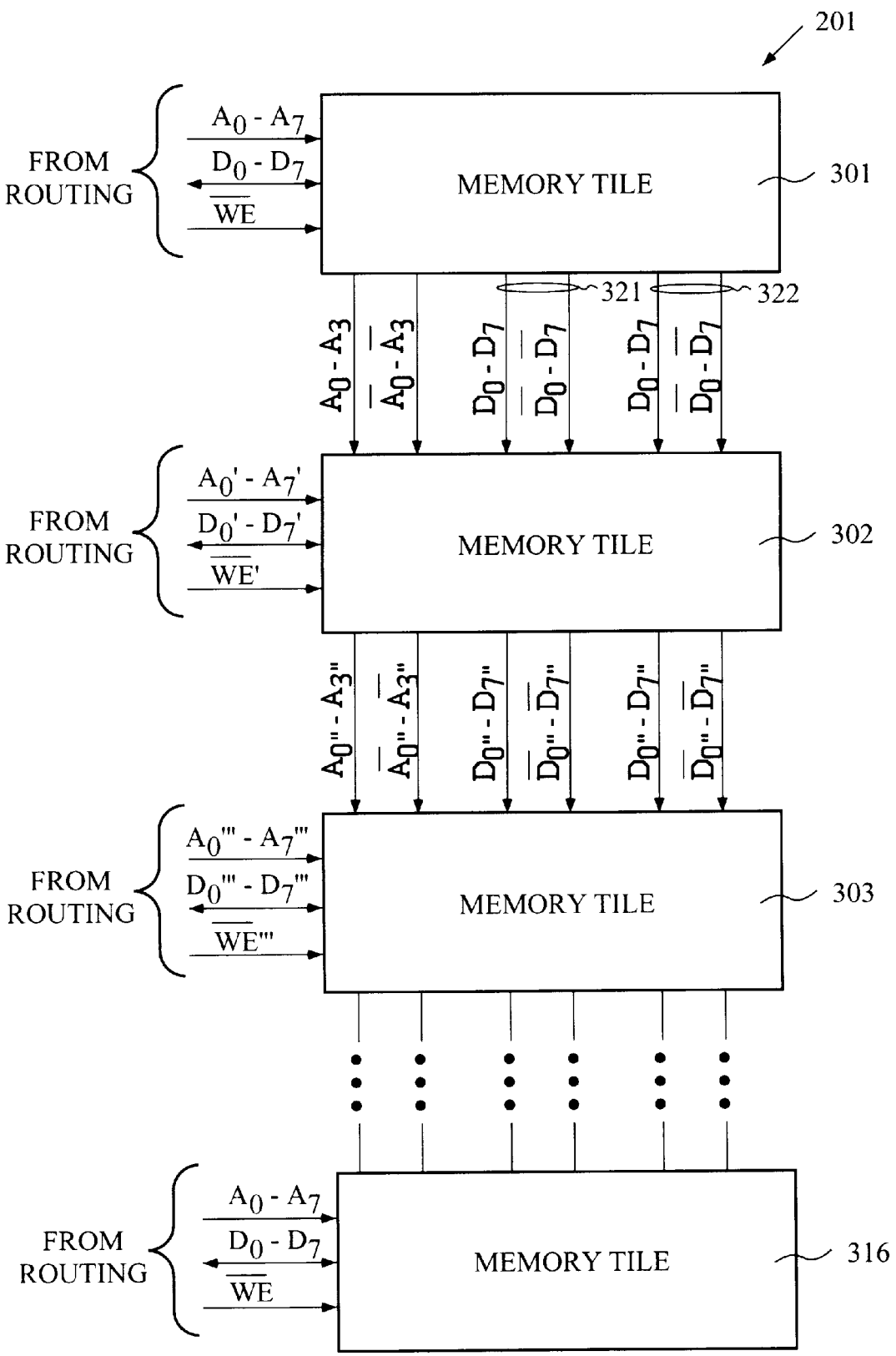
FIG. 3 is a block diagram of one of the composable RAM stripes of FIG. 2.

FIG. 3 is a block diagram of one composable RAM stripe 201. Because composable RAM stripes 202–216 are identical to composable RAM stripe 201, only composable RAM stripe 201 is described in detail.

Composable RAM stripe 201 includes sixteen RAM memory elements, herein referred to as tiles 301–316. Each of memory tiles 301–316 has a storage capacity of 16 bytes, wherein each byte has 8 bits. Memory tiles 301–316 are each coupled to conventional routing circuitry (not shown) within PLD 100, such that each of memory tiles 301–316 is capable of receiving a set of address signals, a set of data signals and a write enable signal. For example, memory tile 301 receives address signals $A_0$–$A_7$, data signals $D_0$–$D_7$ and write enable signal $\overline{WE}$ from the routing circuitry. Because each of memory tiles 301–316 is capable of receiving separate address, data and write enable signals from the routing circuitry, each of memory tiles 301–316 is capable of operating as an independent 16-byte memory array.

Furthermore, two or more of memory tiles 301–316 can be concatenated to allow RAM memory stripe 201 to operate as a single memory having a capacity of up to 256 bytes. For example, to create a 32-byte memory, memory tiles 301 and 302 can be concatenated. In such an example, address signals $A_0$–$A_7$, data signals $D_0$–$D_7$ and write enable signal $\overline{WE}$ are provided to memory tile 301. As described in more detail below, circuitry within memory tile 302 can be programmed to operate in response to the same signals received by memory tile 301. Any number of consecutive memory tiles 301–316 can be concatenated with memory tile 301 to form a memory array which operates in response to the signals received by memory tile 301.

Figure 4A:
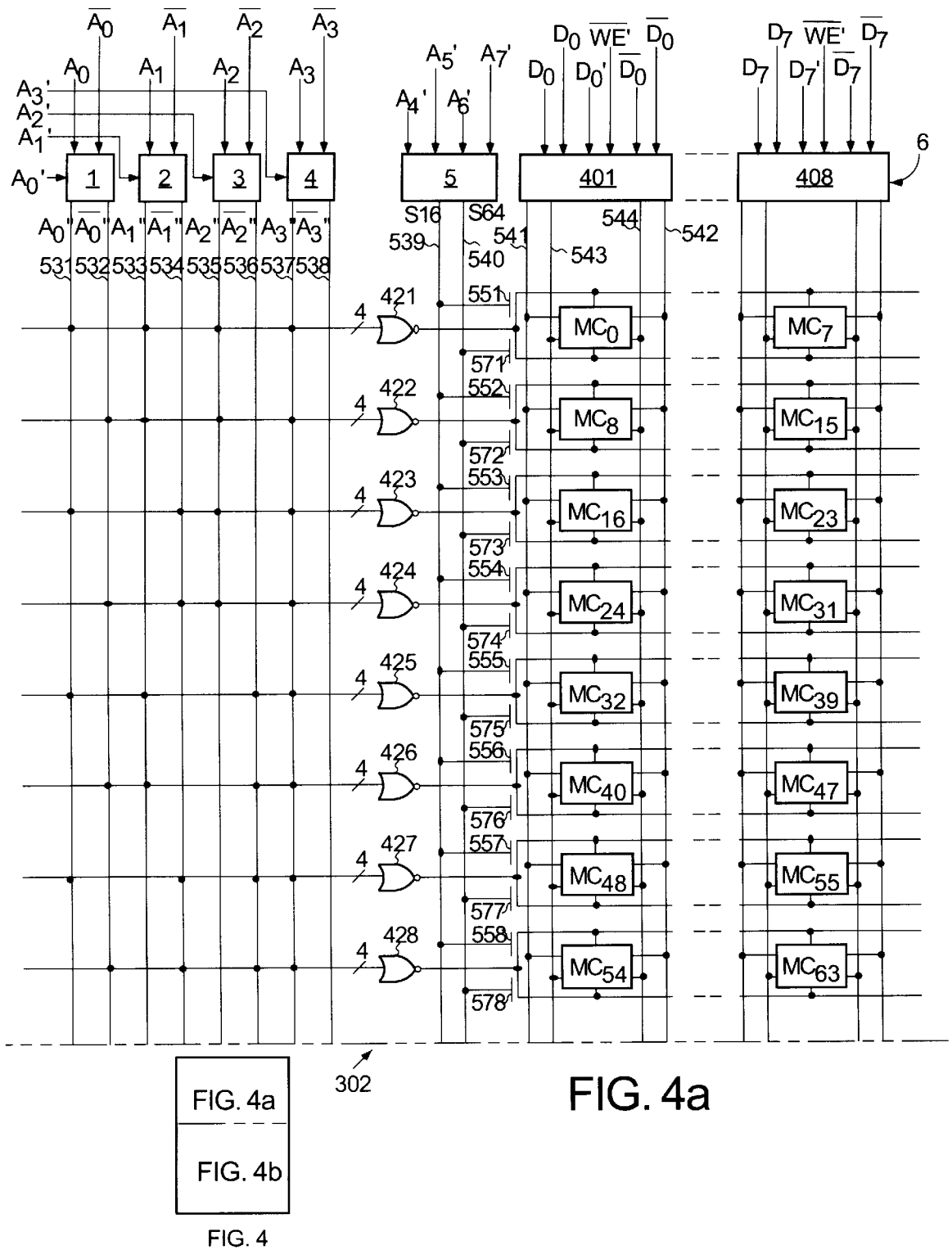
FIG. 4, which consists of FIGS. 4a and 4b, is a schematic diagram of a memory tile in accordance with one embodiment of the invention.
Figure 4B:
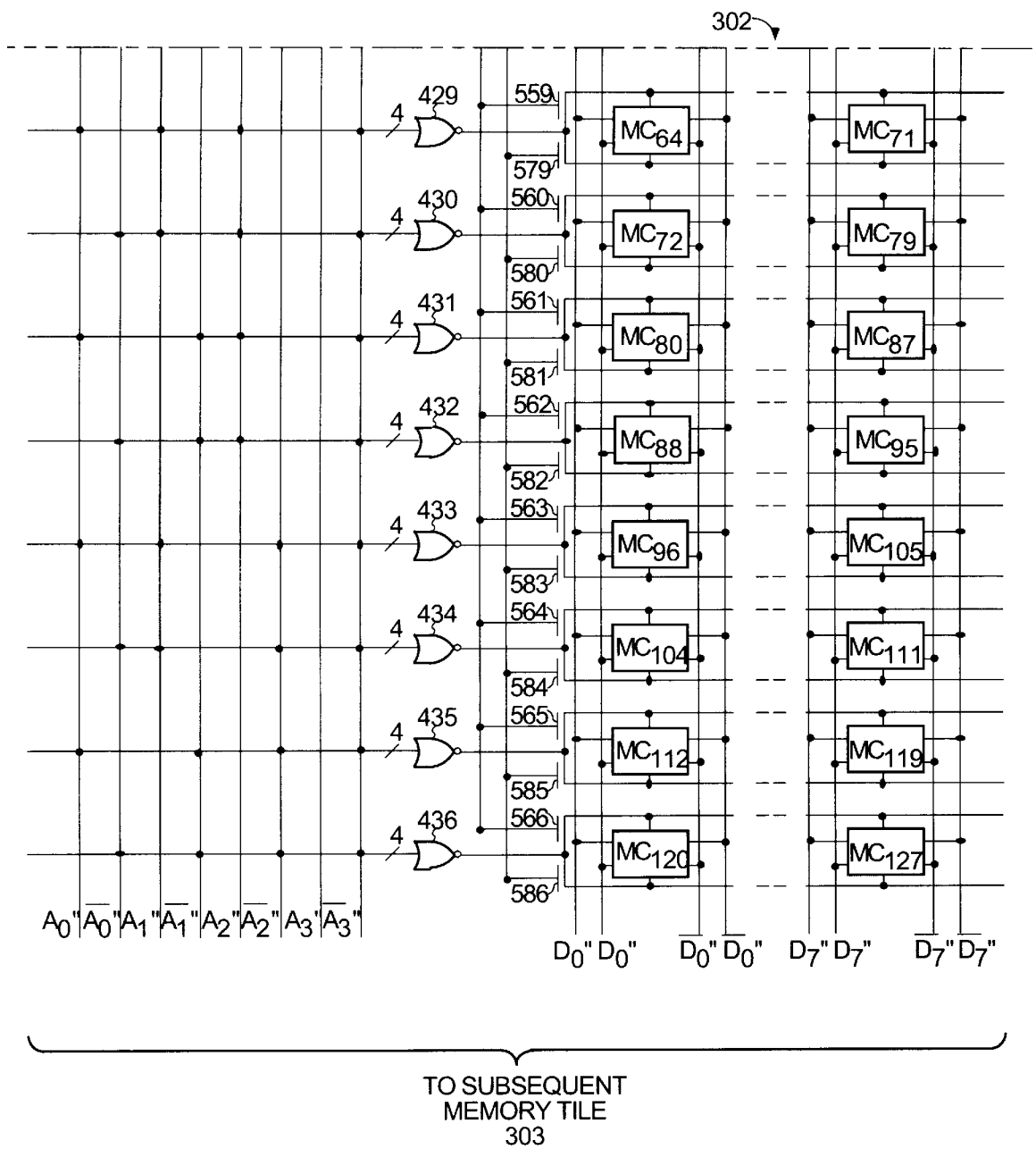

FIG. 4, which consists of FIGS. 4a and 4b as illustrated, is a schematic diagram of memory tile 302. Memory tiles 301 and 303–316 are substantially identical to memory tile 302. Memory tile 301 does not require all of the circuitry present in memory tiles 302–316 because memory tile 301 does not receive signals directly from a previous memory tile in the same manner as memory tiles 302–316. Thus, memory tile 301 may be fabricated without this additional circuitry. Alternatively, memory tile may be fabricated with this additional circuitry, but this additional circuitry may be programmed to pass only the signals $A_0$–$A_7$, $D_0$–$D_7$ and $\overline{WE}$ received from the routing circuitry. Memory tile 302 includes a block of inter-tile logic 6 which includes address bit selection circuits 1–4, memory tile selection circuit 5, and bit line selection circuits 401–408. Because bit line selection circuits 401–408 are substantially identical, only bit line selection circuits 401 and 408 are shown for purposes of clarity. Memory tile 302 also includes NOR gates 421–436, dual-port SRAM cells $MC_0$–$MC_{127}$ (only some of which are shown), word select lines 531–538, port select lines 539–540 and data lines 541–544. Memory tile 302 receives address signals $A_0$–$A_3$ and $\overline{A_0}$–$\overline{A_3}$ and data signals $D_0$–$D_7$ and $\overline{D_0}$–$\overline{D_7}$ from previous memory tile 301. Memory tile 302 also receives address signals $A_0'$–$A_7'$, data signals $D_0'$–$D_7'$ and write enable signal $\overline{WE}'$ from routing circuitry.

In general, address bit selection circuits 1–4 select between the address signals received from memory tile 301 and the address signals received from the routing circuitry to provide the address signals $A_0''$–$A_3''$ and $\overline{A_0''}$–$\overline{A_3''}$ to word select lines 531–538. Address signals $A_0''$–$A_3''$ and $\overline{A_0''}$–$\overline{A_3''}$ are decoded by NOR gates 421–436 to perform a row selection function.

Memory tile selection circuit 5 compares address signals $A_4'$–$A_7'$ with a preprogrammed tile address to determine whether memory tile 302 is being addressed. If memory tile 302 is being addressed, memory tile selection circuit 5 also determines whether dual-port SRAM cells $MC_0$–$MC_{127}$ will be accessed through their first or second ports by providing a port selection signal (e.g., $S_{16}$ or $S_{64}$) on one of port select lines 539 and 540.

Bit line selection circuits 401–408 are programmed either to accept data values $D_0'$–$D_7'$ and write enable signal $\overline{WE}'$ from the routing circuitry, or to accept data values $D_0$–$D_7$ from previous memory tile 301. Bit line selection circuits 401–408 are also programmed to select the use of a first set of bit lines (e.g., bit lines 541 and 542), or a second set bit lines (e.g., bit lines 543 and 544). The first set of bit lines are used when a relatively small number of memory tiles are concatenated to form a memory array. The second set of bit lines are used when a larger number of memory tiles are concatenated to form a memory array. Typically, when a multiple of four memory tiles are to be concatenated, the second set of bit lines are used. The second set of bit lines introduce less signal delay than the first set of bit lines. In one embodiment, one pass transistor delay per memory tile is introduced by the first set of bit lines and one pass transistor delay per four memory tiles is introduced by the second set of bit lines.

Address bit selection circuits 1–4, memory tile selection circuit 5, and bit line selection circuits 401–408 determine whether memory tile 302 operates as an initial memory tile or as a concatenated memory tile. An initial memory tile is a memory tile which either operates independently of the other memory tiles, or operates as the first memory tile in a chain of concatenated memory tiles. Thus, memory tile 302 would be an initial memory tile in a 16-byte memory which includes only memory tile 302. Likewise, memory tile 302 would be an initial memory tile in a 64-byte memory which includes the series combination of memory tile 302 and subsequent memory tiles 303–305. Memory tile 302 would be considered a concatenated memory tile in any memory which includes the series combination of previous memory tile 301 and memory tile 302.

Address bit selection circuits 1–4, memory tile selection circuit 5 and bit line selection circuits 401–408 are described in more detail below.

Figure 5A:
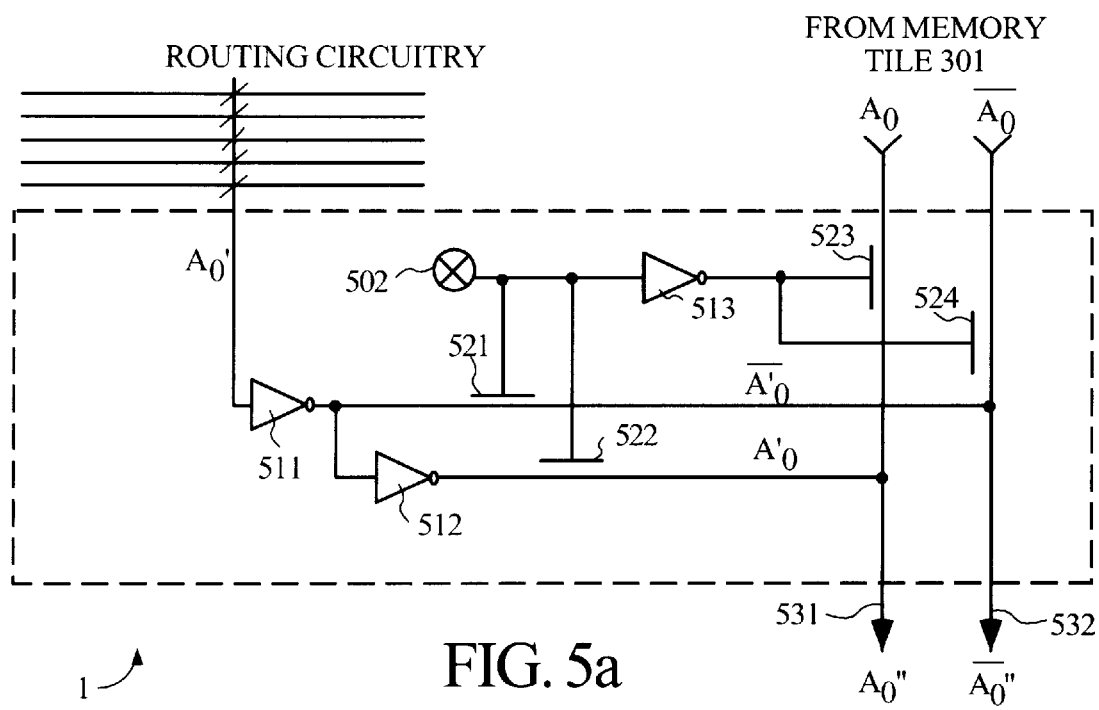
FIGS. 5a and 5b are schematic diagrams of address bit selection circuits in accordance with two embodiments of the invention.

FIG. 5a is a schematic diagram of address bit selection circuit 1. Address bit selection circuits 2–4 are identical to address bit selection circuit 1. Address bit selection circuit 1 includes configurable bit latch 502, inverters 511–513, pass transistors 521–524 and word select lines 531 and 532.

To program memory tile 302 to operate as a concatenated memory tile, address bit selection circuit 1 is programmed to provide address signals $A_0$ and $\overline{A_0}$ from previous memory tile 301 to word select lines 531 and 532, respectively. To do this, configurable bit latch 502 is programmed to provide a logic "0" value to the gates of pass transistors 521 and 522. As a result, pass transistors 521 and 522 are turned off, thereby preventing the address signal $A_0'$ (received from the routing circuitry) from being routed to word select line 531 and preventing address signal $\overline{A_0'}$ from being routed to word select line 532. The logic "0" value provided by configurable bit latch 502 is also provided to inverter 513, causing a logic "1" signal to be provided to the gates of pass transistors 523 and 524. As a result, pass transistors 523 and 524 are turned on and the address signals $A_0$ and $\overline{A_0}$ from previous memory tile 301 are provided to word select lines 531 and 532 as address signals $A_0''$ and $\overline{A_0}''$ respectively.

To program memory tile 302 to operate as an initial memory tile, address bit selection circuit 1 is programmed to provide address signal $A_0'$ and the inverse of address signal $A_0'$ (i.e., $\overline{A_0'}$) from the routing circuitry to word select lines 531 and 532, respectively. To accomplish this, address signal $A_0'$ is routed from the routing circuitry to the input terminal of inverter 511 (using, for example, conventional pass transistors and/or multiplexers), and configurable bit latch 502 is programmed to provide a logic "1" value to the gates of pass transistors 521 and 522. The logic "1" value provided by configurable bit latch 502 causes pass transistors 521 and 522 to turn on. In this manner, address signal $A_0'$ is routed through inverters 511–512 and pass transistor 522 to word select line 531 as address signal $A_0''$. In addition, by routing address signal $A_0'$ through inverter 511 and pass transistor 521, the inverse of address signal $A_0'$ is provided to word select line 532 as address signal $\overline{A_0}''$.

In the initial memory tile configuration, configurable bit latch 502 also provides a logic "1" value to inverter 513. As a result, a logic "0" value is provided to the gates of pass transistors 523 and 524, thereby turning off pass transistors 523 and 524. As a result, address signals $A_0$ and $\overline{A_0}$ are prevented from being transmitted to word select lines 531 and 532.

Figure 5B:
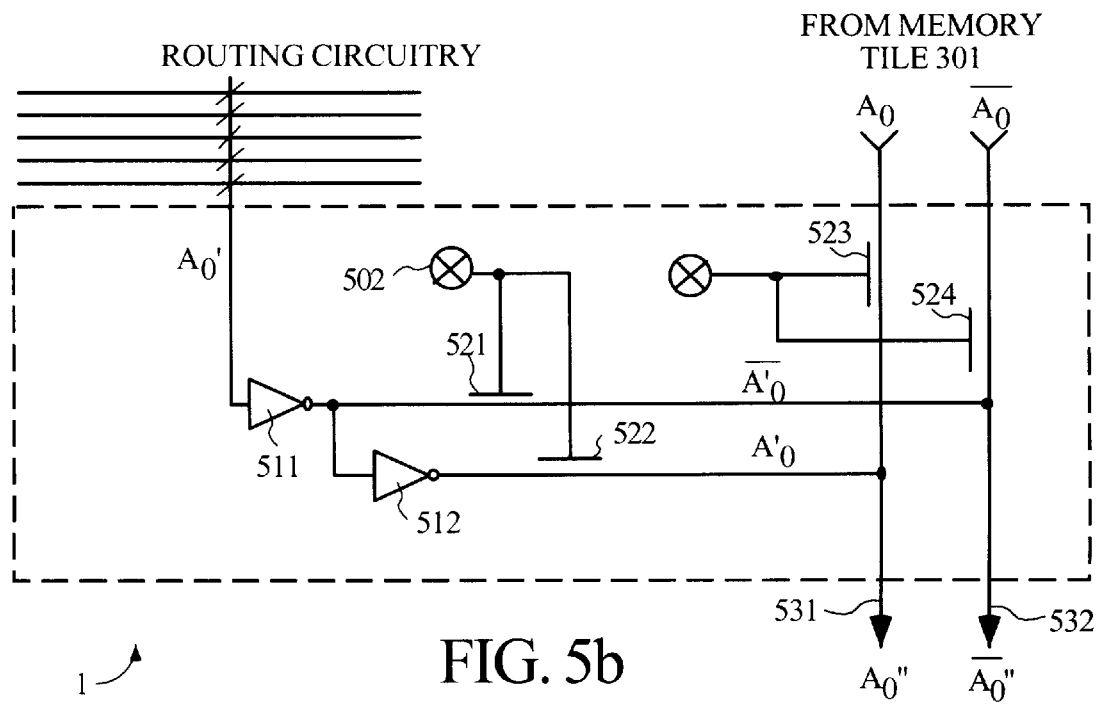

FIG. 5b is a schematic diagram of address bit selection circuit 1 in accordance with an alternative embodiment. Similar elements in FIGS. 5a and 5b are labeled with similar reference numbers. The address bit selection circuit 1 of FIG. 5b includes an additional configurable bit latch 503 which is coupled to the gates of pass transistors 523 and 524. Configurable bit latch 503 thereby allows pass transistors 523 and 524 to be controlled independently. The address bit selection circuit 1 of FIG. 5b allows the same modes of operation as the address bit selection circuit 1 of FIG. 5a, and also provides one additional mode. If configurable bit latches are both programmed to provide logic "1" values, then pass transistors 521–524 are all turned on. This allows address signal $A_0'$ and its inverse ($\overline{A_0'}$) to be transmitted to subsequent memory tile 303 as address signals $A_0''$ and $\overline{A_0}''$ and also to previous memory tile 301 as address signals $A_0$ and $\overline{A_0}$. If configurable bit latches are both programmed to provide logic "0" values, then pass transistors 521–524 are all turned off, thereby disconnecting tile 302 from memory tile 301 above, permitting memory tile 301 to be used independently. Thus, tile 302 is driven from tile 303 or some other lower tile. In this manner, the address bit selection circuit 1 of FIG. 5b provides additional flexibility in routing address signals.

Address bit selection circuits 2–4 operate in the same manner as address bit selection circuit 1. As a result, four address signals $A_0''-A_3''$ and their complements $\overline{A_0}''-\overline{A_3}''$ are provided to word select lines 531–538. Address signals $A_0''-A_3''$ and $\overline{A_0}''-\overline{A_3}''$ are used to address the 16 bytes of memory tile 302 by selectively providing these address signals to NOR gates 421–436. The interconnections made between word select lines 531–538 and NOR gates 421–436 for this addressing scheme are illustrated in FIG. 4. Thus, if signals $A_0''-A_3''$ are all logic "0" values (and signals $\overline{A_0}''-\overline{A_3}''$ are all logic "1" values), then the output signal of NOR gate 421 is a logic "1" value, and the output signals of NOR gates 422–436, are all logic "0" values. As described in more detail below, this allows access to the first row of memory cells $MC_0-MC_7$ of memory tile 302 (assuming that memory tile 302 is selected by memory tile selection circuit 5).

Address signals $A_0''-A_3''$ and $\overline{A_0}''-\overline{A_3}''$ are provided to subsequent memory tile 303 (FIG. 3). If memory tile 303 is to operate as a concatenated memory tile, address bit selection circuits (not shown) in memory tile 303 are programmed to select these address signals $A_0''-A_3''$ and $\overline{A_0}''-\overline{A_3}''$ for use within memory tile 303. Alternatively, if memory tile 303 is to operate as an initial memory tile, the address bit selection circuits of memory tile 303 are programmed to select address signals $A_0'''-A_3'''$ for use within memory tile 303.

Figure 6:
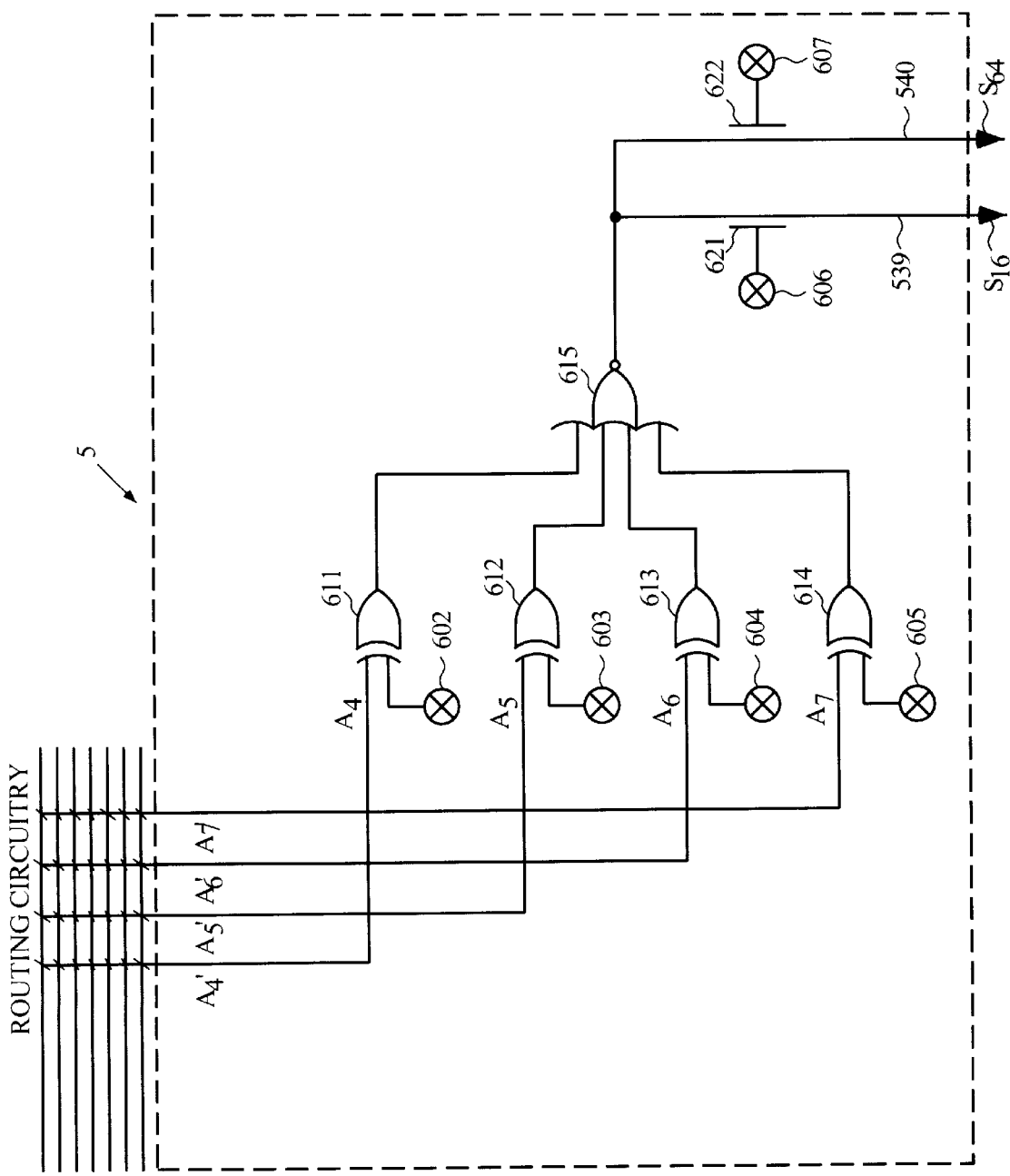
FIG. 6 is a schematic diagram of a memory tile selection circuit in accordance with one embodiment of the invention.

FIG. 6 is a schematic diagram of memory tile selection circuit 5 which includes configurable bit latches 602–607, exclusive OR gates 611–614, Four-input NOR gate 615 and pass transistors 621 and 622. The routing circuitry is programmed (using, for example, conventional pass transistors and/or multiplexers) to provide upper address signals $A_4'-A_7'$ from the routing circuitry to input terminals of exclusive OR gates 611–614, respectively. If memory tile 302 is to be operated as a concatenated memory tile, the routing circuitry is configured such that each of the concatenated memory tiles receive the same upper address signals.

Configurable bit latches 602–605 are programmed to provide signals which are representative of the particular address selected for memory tile 302. For example, if memory tile 302 is assigned an address of 0001 (i.e., $A_7'=0$, $A_6'=0$, $A_5'=0$, and $A_4'1$), configurable bit latch 602 is programmed to provide a logic "1" value to exclusive OR gate 611 and configurable bit latches 603–605 are programmed to provide logic "0" values to exclusive OR gates 612–614, respectively. Thus, when address signals $A_7', A_6', A_5'$ and $A_4'$ have logic "0", "0", "0", and "1" values, respectively, the output signals from exclusive OR gates 611–614 are all logic "0" values. Four-input NOR gate 615 receives these logic "0" values, and in response, provides an output signal having a logic "1" value. The NOR gate 615 will only provide a logic "1" value when address signals $A_4'-A_7'$ correspond to the values programmed in configurable bit latches 602–605. The four address signals $A_4'-A_7'$ are capable of addressing each of the sixteen memory tiles 301–316 in composable RAM stripe 201.

The output signal from NOR gate 615 is either routed through pass transistor 621 to port select line 539 as port select signal $S_{16}$, or routed through pass transistor 622 to port select line 540 as port select signal $S_{64}$. Pass transistors 621 and 622 are controlled by configurable bit latches 606 and 607, respectively. Port select line 539 is coupled to the gates of a first group of pass transistors 551–566 (FIG. 4) and port select line 540 is coupled to the gates of a second group of pass transistors 571–586. When memory tile select circuit 5 is programmed to provide port select signal $S_{16}$, and port select signal $S_{16}$ has a logic "1" value, pass transistors 551–566 are turned on. When pass transistors 551–566 are turned on, the word select signals generated by NOR gates 421–436 (FIG. 4) are provided to enable the first ports of memory cells $MC_0$–$MC_{127}$.

Similarly, when memory tile select circuit 5 is programmed to provide port select signal $S_{64}$, and port select signal $S_{64}$ has a logic "1" value, pass transistors 571–586 are turned on. As a result, the word select signals generated by NOR gates 421–436 (FIG. 4) are provided to enable the second ports of memory cells $MC_0$–$MC_{127}$.

Figure 7:
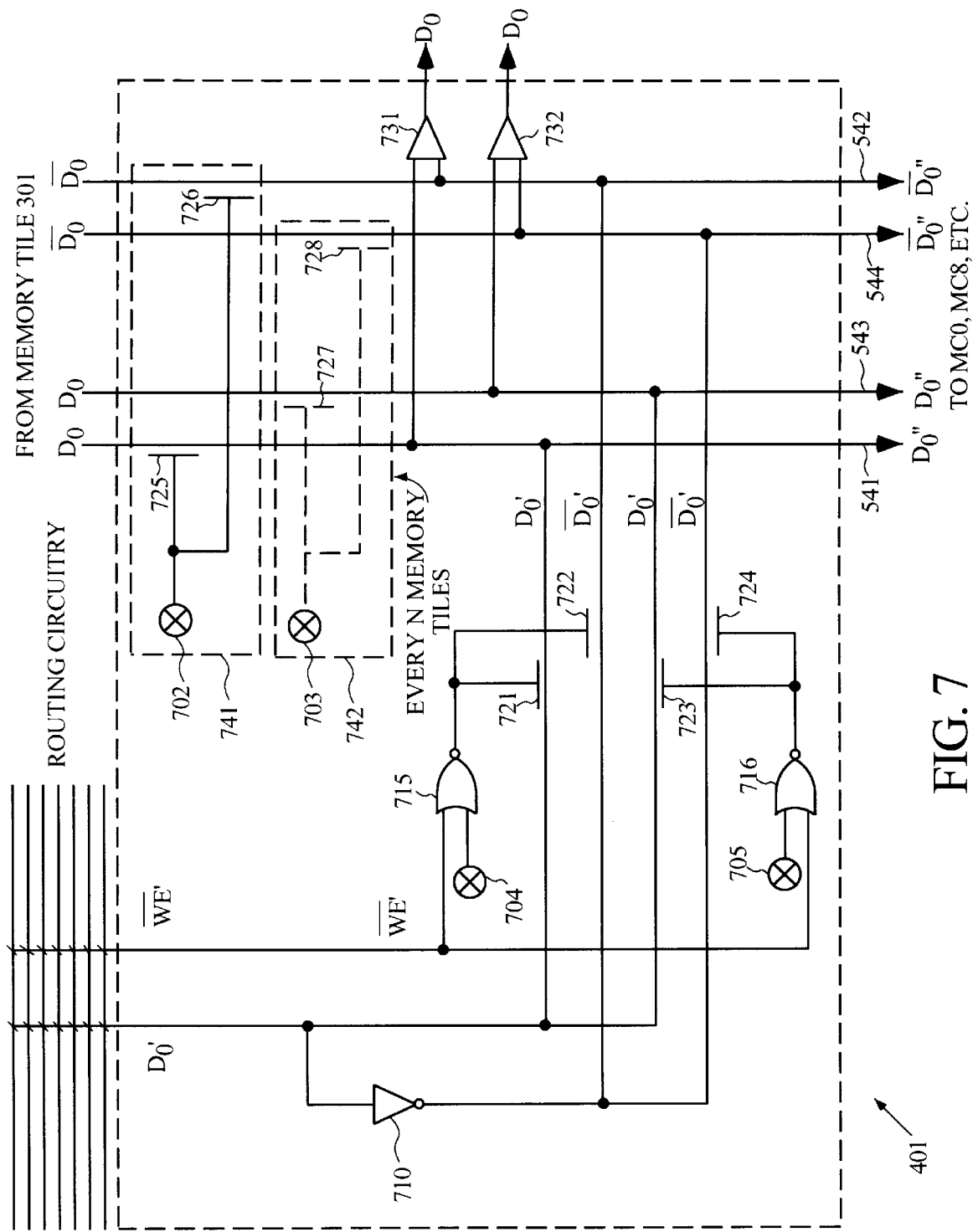
FIG. 7 is a schematic diagram of a bit line select circuit in accordance with one embodiment of the invention.

FIG. 7 is a schematic diagram of bit line select circuit 401. Bit line select circuits 402–408 are substantially identical to bit line select circuit 401. Bit line select circuit 401 includes configurable bit latches 702–705, inverter 710, NOR gates 715–716, pass transistors 721–728, sense amplifiers 731–732 and bit lines 541–544. Configurable bit latch 702 and pass transistors 725 and 726 form a first configuration circuit 741 and configurable bit latch 703 and pass transistors 727 and 728 form a second configuration circuit 742. Bit line select circuit 401 receives data signal $D_0'$ and write enable signal $\overline{WE}'$ from the routing circuitry and data signals $D_0$ and $\overline{D_0}$ from previous memory tile 301.

Bit line select circuit 401 is programmed to determine (1) whether data signals $D_0$ and $\overline{D_0}$ or data signals $D_0'$ and $\overline{D_0'}$ are transmitted through bit line selection circuit 401 as data signals $D_0''$ and $\overline{D_0''}$ and (2) whether data signals $D_0''$ and $\overline{D_0''}$ are transmitted on first bit lines 541 and 542 or on second bit lines 543 and 544. The first bit lines include the bit lines, such as bit lines 541 and 542, which are coupled to the first ports of memory cells $MC_0$–$MC_{127}$. The second bit lines include bit lines, such as bit lines 543 and 544, which are coupled to the second ports of memory cells $MC_0$–$MC_{127}$. As described in more detail below, the first or second set of bit lines are selected based on the number of memory tiles 301–316 which are to be concatenated.

Bit line select circuits 401–408 must be programmed in a manner consistent with memory tile select circuit 5. For example, if bit line select circuits 401–408 are programmed to select the first bit lines (which are coupled to the first ports of memory cells $MC_0$–$MC_{127}$), then memory tile select circuit 5 must be programmed to provide port select signal $S_{16}$ (which provides access to the first ports of memory cells $MC_0$–$MC_{127}$ by enabling pass transistors 551–566).

Memory tile 302 can be programmed to be an initial memory tile in a series concatenation which also includes any consecutive number of memory tiles 303–316. If memory tile 302 is to operated as an initial memory tile, configurable bit latch 702 and optional configurable bit latch 703 (if present) are programmed to provide logic "0" values to the gates of pass transistors 725–728, thereby preventing bit line selection circuit 401 from passing data signals $D_0$ and $\overline{D_0}$ from previous memory tile 301. Although data signal $D_0$ is shown as existing on both bit line 541 (a first bit line) and bit line 543 (a second bit line) and data signal $\overline{D_0}$ is shown as existing on both bit line 542 (a first bit line) and bit line 544 (a second bit line), it is understood that data signal $D_0$ exists on either bit line 541 or bit line 543, but not on both of these bit lines. Similarly, data signal $\overline{D_0}$ exists on either bit line 542 or bit line 544, but not on both. Moreover, if data signal $D_0$ exists on bit line 541, then data signal $\overline{D_0}$ exists on bit line 542. Similarly, if data signal $D_0$ exists on bit line 543, then data signal $\overline{D_0}$ exists on bit line 544.

Still assuming that memory tile 302 is to be configured as an initial memory tile, one of configurable bit latches 704 and 705 is programmed to provide a logic "0" value and the other is programmed to provide a logic "1" value. If first bit lines 541 and 542 are to be selected, configurable bit latch 704 is programmed to provide a logic "0" value to NOR gate 715 and configurable bit latch 705 is programmed to provide a logic "1" value to NOR gate 716. The logic "1" value provided by configurable bit latch 705 forces the output signal of NOR gate 716 to a logic "0" value, thereby turning off pass transistors 723 and 724 and preventing data signals $D_0'$ and its inverse from being transmitted to bit lines 543 and 544.

In addition to receiving a logic "0" value from configurable bit latch 704, NOR gate 715 also receives write enable signal $\overline{WE}'$. Thus, write enable signal $\overline{WE}'$ controls the output signal of NOR gate 715, which in turn, controls pass transistors 721 and 722. When write enable signal $\overline{WE}'$ has a logic "0" value, the output signal of NOR gate 715 goes high, thereby turning on pass transistors 721 and 722. As a result, data signals $D_0'$ and $\overline{D_0'}$ are transmitted to bit lines 541 and 542 as data signals $D_0''$ and $\overline{D_0''}$, respectively.

Data signals $D_0''$ and $\overline{D_0''}$, are transmitted to the first port each of the memory cells in the first column of the memory array in memory tile 302 (e.g., memory cells $MC_0$, $MC_8$, $MC_{16}$, $MC_{24}$, etc.) Data signals $D_0''$ and $\overline{D_0''}$, are also transmitted through memory tile 302 to memory tile 303. Memory tile 303 can be configured to operate as a concatenated memory tile. Configuration as a concatenated memory tile is described in more detail below in connection with memory tile 302.

If write enable signal $\overline{WE}'$ has a logic "1" value, pass transistors 721 and 722 are turned off. Under these conditions, data signals $D_0''$ and $\overline{D_0''}$ can be read out of an addressed memory cell to sense amplifier 731, which is coupled across bit lines 541 and 542.

Memory tile 302, when operated as an initial memory tile, can also be programmed to utilize second bit lines 543 and 544, instead of first bit lines 541 and 542. To do this, configurable bit latches 704 and 705 are programmed to provide logic "1" and logic "0" values, respectively.

If memory tile 302 is to be operated as a concatenated memory tile with previous memory tile 301, configurable bit latches 704 and 705 are programmed to provide logic "0" values to NOR gates 715 and 716, respectively. As a result, pass transistors 721–724 are turned off and data signals $D_0'$ and $\overline{D_0'}$, are prevented from being passed to bit lines 541–544. If previous memory tile 301 is programmed to provide data signals $D_0$ and $\overline{D_0}$ on first bit lines 541 and 542, configurable bit latch 702 is programmed to provide a logic "1" value to the gates of pass transistors 725 and 726, thereby turning these pass transistors on. Consequently, transistors 725 and 726 pass data signals $D_0$ and $\overline{D_0}$ to first bit lines 541 and 542 as data signals $D_0''$ and $\overline{D_0''}$, respectively.

Each of the bit line select circuits in memory tiles 301–316 includes circuitry which corresponds to first configuration circuit 741 of bit line select circuit 401. Thus, the first bit lines advantageously provide flexibility to concatenate any number of memory tiles 301–316. When the first bit lines are selected, each concatenated memory tile introduces a delay on the bit lines equal to the delay introduced by one pass transistor. For example, if memory tiles 301–303 are concatenated and the first bit lines are selected, a bit line delay corresponding to one pass transistor would be introduced by each of memory tiles 302 and 303 (for a total delay corresponding to two pass transistors). If all sixteen memory tiles 301–316 are concatenated and the first bit lines are selected, a total bit line delay corresponding to fifteen pass transistors would be introduced. Thus, while the first bit lines provide flexibility by allowing any number of the memory tiles to be concatenated, the bit line selection circuits which provide this flexibility causes non-trivial signal delay on the first bit lines.

Thus, in accordance with one embodiment of present invention, the second bit lines include circuitry which allows a larger number of memory tiles to be concatenated with less bit line delay. This circuitry is illustrated in FIG. 7 as second configuration circuit 742. However, second configuration circuit 742 operates in a manner similar to first configuration circuit 741. Second configuration circuit 742 is not present in every memory tile, but rather in non-consecutive memory tiles. Although second configuration circuit 742 would typically not be included in memory tile 302, circuit 742 is shown in connection with memory tile 302 for ease of illustration. In one embodiment, memory tiles 305, 309, and 313 (FIG. 3) include a second configuration circuit 742. In such an embodiment, the second bit lines are used to form memory arrays which include groups of four memory tiles. For example, the second bit lines can be used to connect memory tiles 301–304 without introducing bit line delay due to pass transistors. In another example, the second bit lines can be used to connect memory tiles 305–312 and only introduce a bit line delay corresponding to the delay associated with a single pass transistor (present in memory tile 309). In yet another example, the second bit lines can be used to connect all of memory tiles 301–316 and only introduce a bit line delay corresponding to the delay associated with three pass transistors (present in memory tiles 305, 309 and 313). In the foregoing manner, the second bit lines are used to reduce the bit line delay (compared to the first bit lines) of larger concatenated memories.

Figure 8:
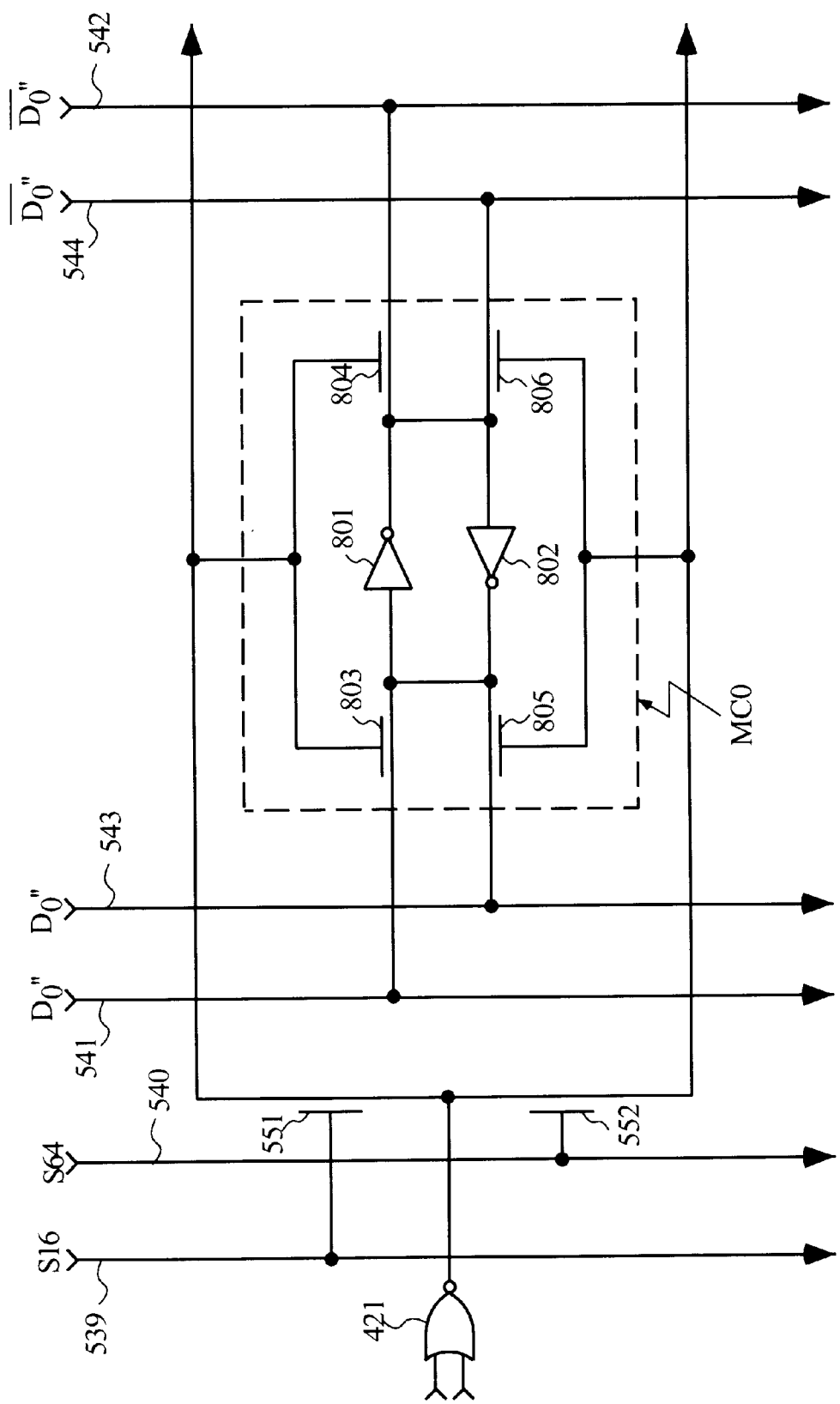
FIG. 8 is a schematic diagram of a dual-port SRAM memory cell connected in accordance with one embodiment of the invention.

FIG. 8 is a schematic diagram of dual-port SRAM memory cell $MC_0$, wherein memory cells $MC_1$–$MC_{127}$ are identical to memory cell $MC_0$. Memory cell $MC_0$ includes inverters 801 and 802 which are coupled to form a latch. Memory cell $MC_0$ also includes pass transistors 803–805. The gates of pass transistors 803 and 804 are selectively connected to the output terminal of NOR gate 421 through pass transistor 551. The gates of pass transistors 805 and 806 are selectively connected to the output terminal of NOR gate 421 through pass transistor 552. Pass transistors 551 and 552 are controlled by port select signals $S_{16}$ and $S_{64}$, respectively.

As previously described in connection with FIG. 6, only one of port select signals $S_{16}$ and $S_{64}$ is selected for use by memory tile select circuit 5. The following example assumes that port select signal $S_{16}$ is selected. If port select signal $S_{16}$ has a logic "1" value, pass transistor 551 is turned on and the word select signal from NOR gate 421 is provided to pass transistors 803 and 804. When the word select signal from NOR gate 421 has a logic "1" value (i.e., when memory cell $MC_0$ is being addressed), pass transistors 803 and 804 are turned on. During a write operation, this causes the data signals on bit lines 541 and 542 to be applied to memory cell $MC_0$ and stored in the latch formed by inverters 801 and 802. During a read operation, this causes the data signals stored in memory cell $MC_0$ to be provided to sense amplifier 731 (FIG. 7). The port of memory cell $MC_0$ which is accessed by pass transistors 803 and 804 is arbitrarily defined as the first port of dual-port memory cell $MC_0$.

Conversely, when port select signal $S_{64}$ is selected for use, data signals on bit lines 543 and 544 are provided to memory cell $MC_0$ and stored in the latch formed by inverters 801 and 802 during a write operation. During a read operation, the data signals stored in memory cell $MC_0$ is provided to sense amplifier 732 (FIG. 7). The port of memory cell $MC_0$ which is accessed by pass transistors 805 and 805 is defined as the second port of dual-port memory cell $MC_0$ When port select signal $S_{16}$ is selected for use, bit line select circuit 401 must be programmed to provide data values on first bit lines 541 and 542 (rather than on second bit lines 543 and 544). Moreover, when port select signal $S_{64}$ is selected for use, bit line select circuit 401 must be programmed to provide data values on second bit lines 543 and 544 (rather than on first bit lines 541 and 542).

In the above described embodiment, composable RAM array 102 is located at a separate dedicated area on PLD 100, and can be coupled to the CLB array 101 through the programmable routing circuitry of PLD 100. In accordance with another embodiment of the present invention, composable RAM array 102 is distributed throughout PLD 100. In this embodiment, each of the memory tiles in composable RAM array 102 is located adjacent to an associated one of the CLBs in CLB array 101. Each of the memory tiles can be coupled to its associated CLB, thereby allowing the memory tiles to be accessed through the CLBs. This embodiment is described in more detail below in connection with FIGS. 9 and 10.

Figure 9:
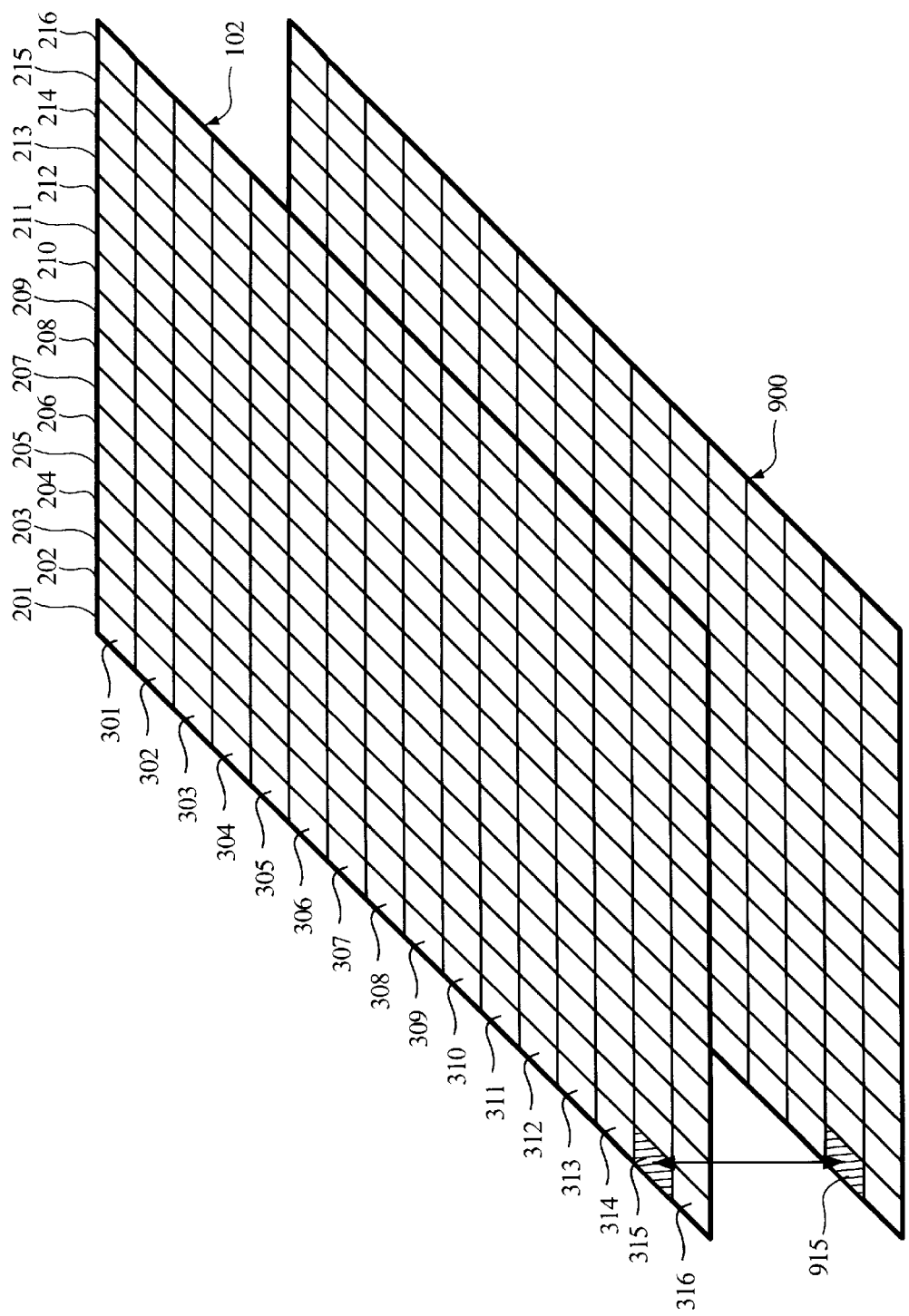
FIG. 9 is a schematic illustration of a composable RAM array and a CLB array in accordance with another embodiment of the present invention.

FIG. 9 is a schematic illustration of composable RAM array 102 and an associated CLB array 900 in accordance with the present embodiment. As described above, composable RAM array 102 includes sixteen composable RAM stripes 201–216, each having sixteen memory tiles. For example, composable RAM stripe 201 includes memory tiles 301–316. As a result, there are 256 memory tiles in composable RAM array 102. Composable RAM stripes 201 and memory tiles 301–316 have been described above in connection with FIGS. 1–8. CLB array 900 includes 256 CLBS, arranged in a 16×16 array. Each of the CLBs in CLB array 900 corresponds with one of the memory tiles in composable RAM array 102. For example, CLB 915 of CLB array 900 corresponds with memory tile 315 of composable RAM array 102. Although the present example describes 16×16 arrays, it is understood that other array sizes can be used in other embodiments.

In FIG. 9, composable RAM array 102 is illustrated as being located in a first plane, and CLB array 900 is illustrated as being located in a second plane, even though both RAM array 102 and CLB array 900 are located on the same silicon substrate. This illustration is intended to indicate that the planes are separate, but can be selectively coupled to one another through the programmable routing circuitry of PLD 100 when desired.

Figure 10:
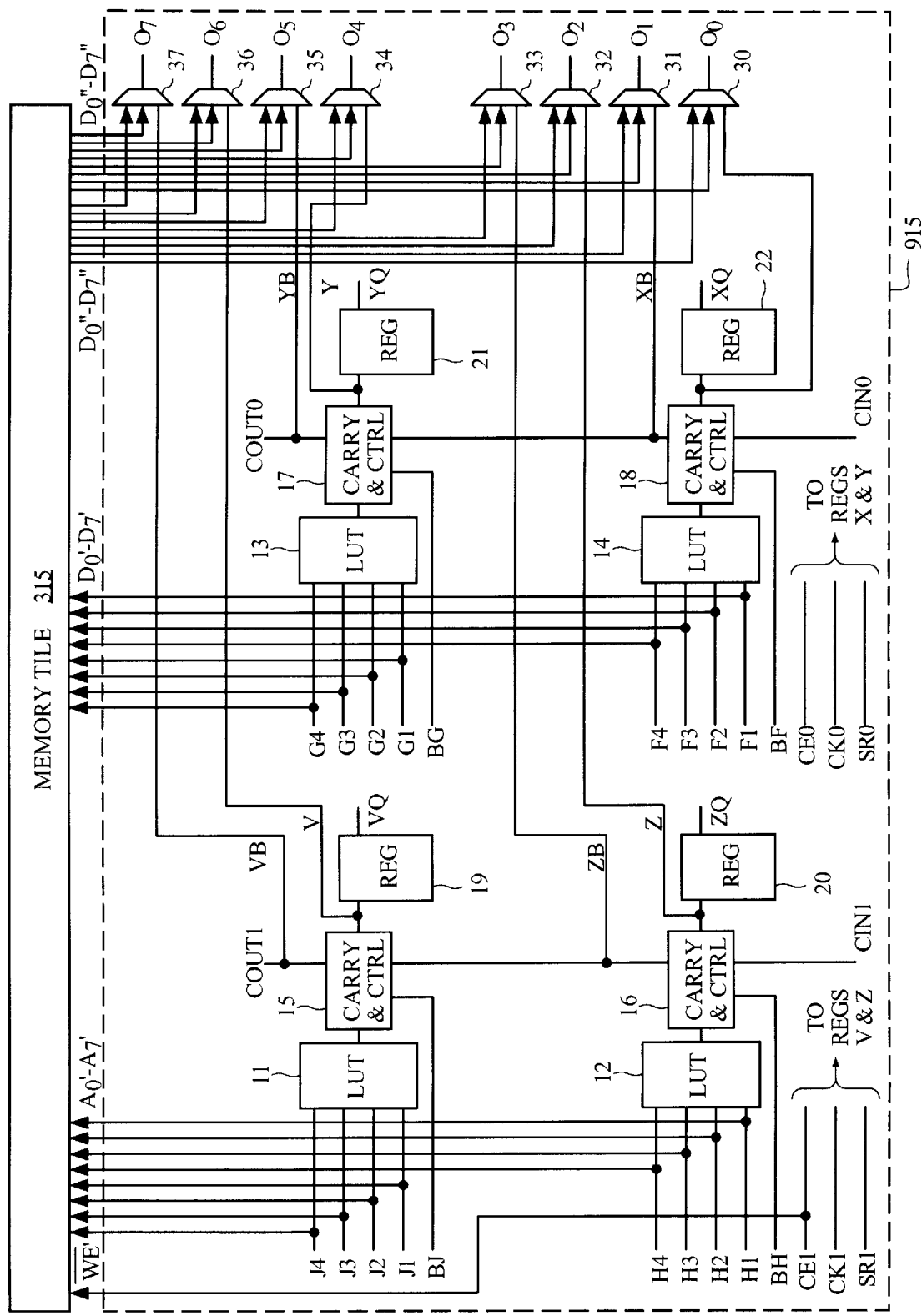
FIG. 10 is a block diagram illustrating a memory tile and a CLB of the structure of FIG. 9 in accordance with one embodiment of the present invention.

FIG. 10 is a block diagram illustrating CLB 915 and memory tile 315 in accordance with one embodiment of the present invention. CLB 915 includes look-up tables (LUTs) 11–14, carry/control circuits 15–18 and registers 19–22, which are connected as illustrated. LUTs 11, 12, 13 and 14 receive input signals J1–J4, H1–H4, G1–G4 and F1–F4, respectively, from the routing circuitry (not shown) of PLD 100. LUTs 11–14 are typically programmed to provide corresponding output signals to carry/control circuits 15–18, respectively, in response to these received input signals. Carry/control circuits 15–18 are also coupled to receive input signals BJ, BH, BG and BP, respectively, from the routing circuitry. Carry/control circuits 16 and 18 are coupled to receive carry input signals CIN1 and CIN0, respectively, from the routing circuitry. Carry/control circuits 15 and 17 are coupled to receive carry input signals from carry/control circuits 16 and 18, respectively, and to provide carry output signals COUT1 and COUT0, respectively, to the routing circuitry.

The carry output signals provided by carry/control circuits 15–18 are also routed to multiplexers 37, 33, 35 and 31, respectively, as output signals VB, ZB, YB and XB, respectively. Carry/control circuits 15–18 also provide output signals V, Z, Y and X, respectively, to registers 19, 20, 21 and 22, respectively, and to multiplexers 36, 32, 34, and 30, respectively. Registers 19–22, in turn, provide output signals VQ, ZQ, YQ and XQ, respectively, to the routing circuitry. Registers 19 and 20 are controlled by clock enable signal CE1, clock signal CK1 and set/reset signal SR1, Similarly, registers 21 and 22 are controlled by clock enable signal CE0, clock signal CK0 and set/reset signal SR0. These signals are received from the routing circuitry of PLD 100. LUTs 11–14, carry/control circuits 15–18 and registers 19–22 are described in more detail in commonly owned co-pending U.S. patent application Ser. No. 08/806,997 entitled "FPGA Repeatable Interconnect Structure with Hierarchical Interconnect Lines" by Young et al., which is hereby incorporated by reference in its entirety.

In accordance with the present invention, the clock enable signal CE1 is routed to memory tile 315 as the write enable signal $\overline{WE}'$. The input signals J1–J4 and H1–H4 are routed to memory tile 315 as the address signals $A_0'$–$A_7'$. In addition, the input signals G1–G4 and F1–F4 are routed to memory tile as the input data signals $D_0'$–$D_7'$. In this manner, memory tile 315 receives the input signals necessary to operate in the manner described above.

In other embodiments, the input signals can be provided to memory tile 315 in other manners. For example, in another embodiment, the SR0 signal can be routed to memory tile 315 as the write enable signal $\overline{WE}'$. Similarly, the J1–J4 and G1–G4 signals can be routed to memory tile 315 as the address signals $A_0'$–$A_7'$ and the H1–H4 and F1–F4 signals can be routed to memory tile 315 as the input data signals $D_0'$–$D_7'$.

Also, in accordance with the present invention, the data output signals $D_0''$–$D_7''$ from memory tile 315 are provided to multiplexers 30–37, respectively, of CLB 915. Multiplexers 30–37 can be configured to pass either the output signals X, XB, Z, ZB, Y, YB, V, and VB from CLB 915, or the data output signals $D_0''$–$D_7''$ from memory tile 315. In this manner, CLB 915 is capable of routing the data output signals received from memory tile 315 to the routing circuitry of PLD 100.

Figure 11:
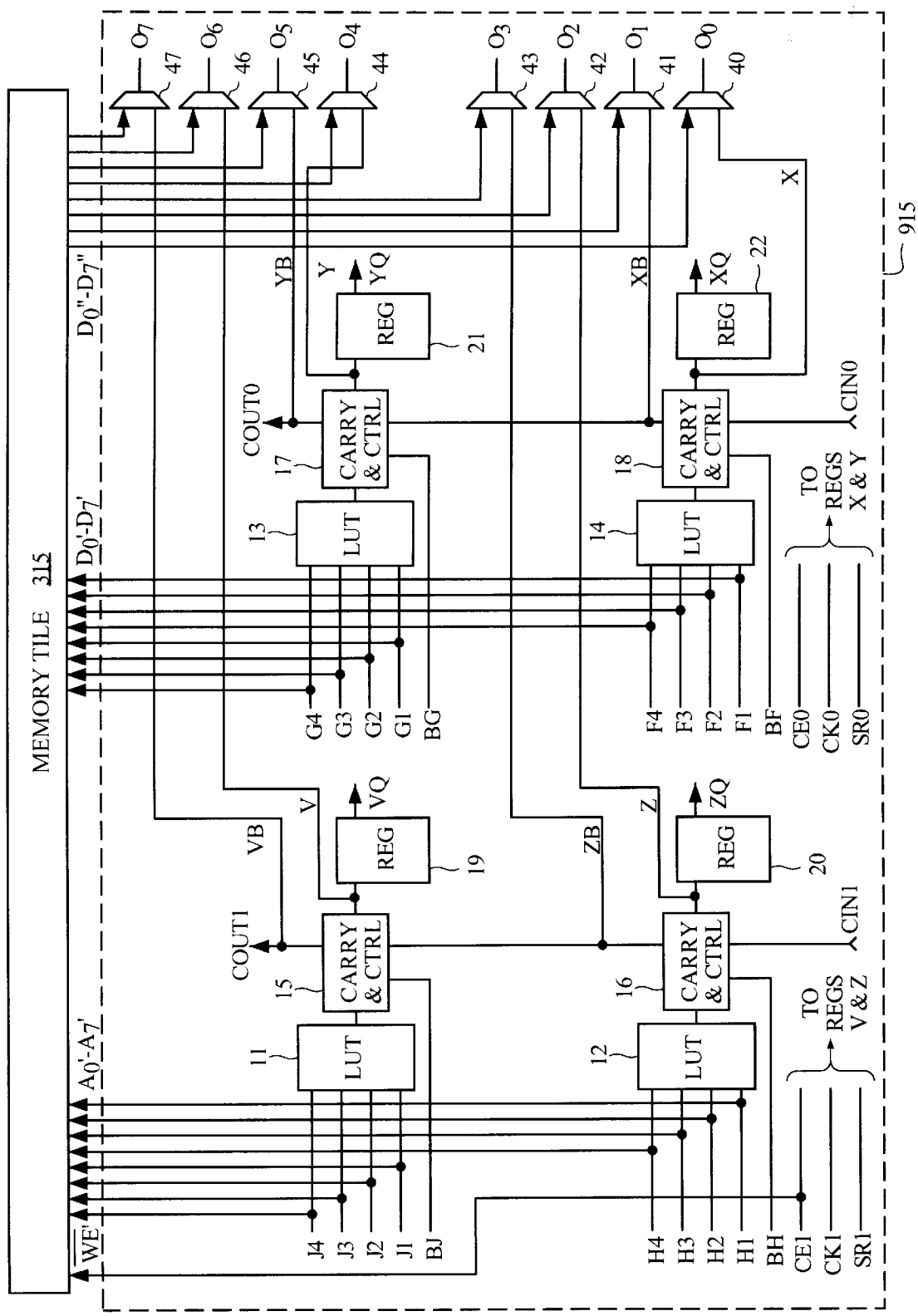
FIG. 11 is a block diagram illustrating a memory tile and a CLB of the structure of FIG. 9 in accordance with another embodiment of the present invention.

It is noted that memory tile 315 (like above-described memory tile 302) is capable of providing two sets of output data signals, namely, a first set of output data signals on the first set of bit lines and a second set of output data signals on the second set of bit lines. Thus, multiplexers 30–37 are 3-to-1 multiplexers which are configured to selectively route either the first set of output data signals provided by memory tile 315, the second set of output data signals provided by memory tile 315, or the output signals provided by CLB 915, In another embodiment of the present invention, the dual-port memory cells in memory tile 315 (and each of the other memory tiles) are replaced with single-port memory cells, such that each memory tile has are only one set of bit lines and one set of output data signals. FIG. 11 is a block diagram illustrating memory tile 315 and CLB 915 in accordance with this embodiment. Similar reference numbers refer to similar elements in FIGS. 10 and 11. Note that in FIG. 11, there is only one set of connections for the output data signals $D_0''$–$D_7''$. Also note that in FIG. 11, the output multiplexers 40–47 are 2-to-1 multiplexers.

The modifications to the memory tiles required to support single-port memory cells are trivial, given that the more difficult embodiment, which uses dual-port memory cells, has been described in detail above. When using single-port memory cells, the circuitry that supports the second port of the memory cells is simply eliminated. In this embodiment, there are pass transistors for coupling (or de-coupling) the bit lines in the adjacent memory tiles.

Figure 12:
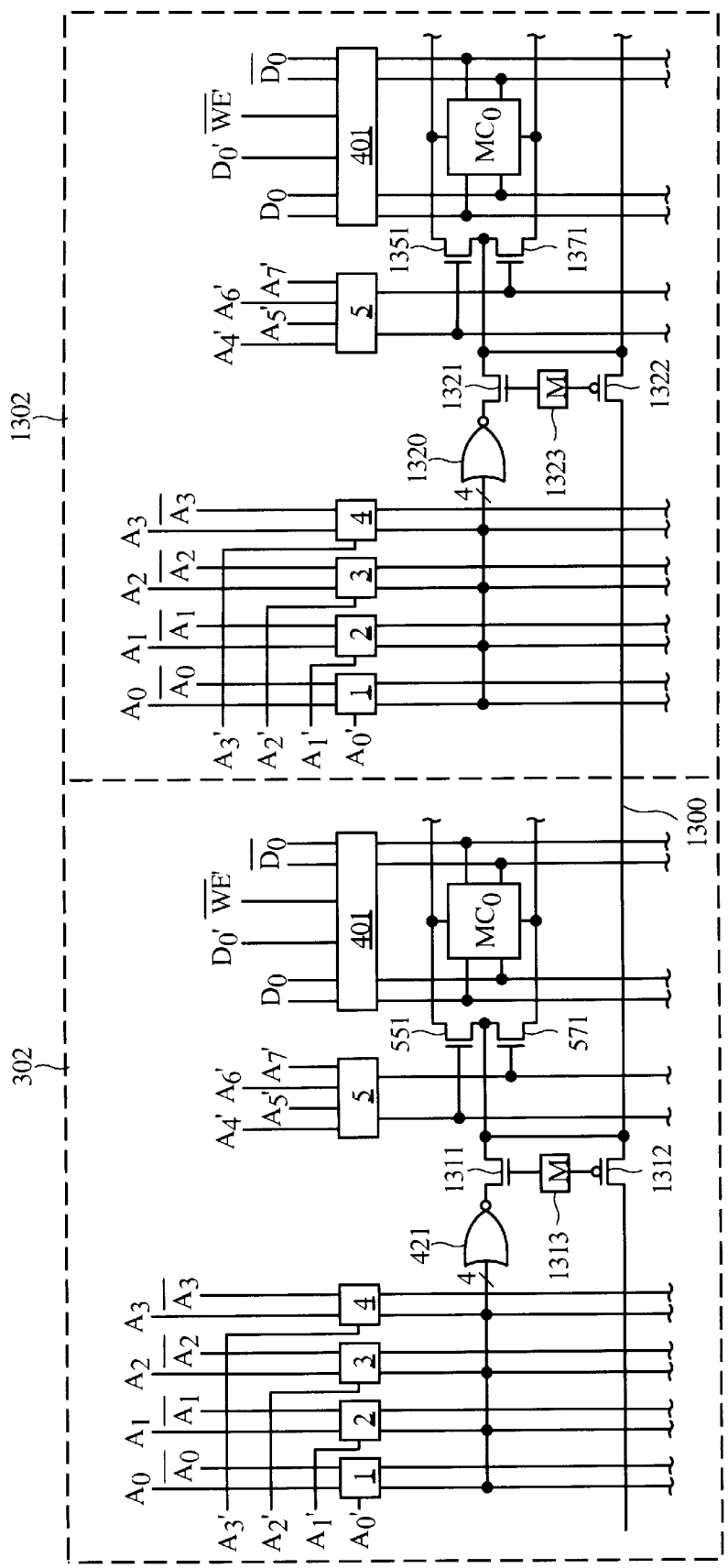
FIG. 12 is a schematic diagram of portions of horizontally adjacent memory tiles in accordance with an embodiment which enables memory expansion along the horizontal axis.

In the above-described embodiment, the composable RAM stripes 201–216 are not expandable along the horizontal axis. However, in other embodiments, the composable RAM stripes 201–216 are modified such that expansion along the horizontal axis is possible. FIG. 12 is a schematic diagram of portions of horizontally adjacent memory tiles 302 and 1302 in accordance with one embodiment, which enables memory expansion along the horizontal axis. One of memory tiles 302 and 1302 are configured to receive input signals $A_0$–$A_3$, while both tiles 302 and 1302 are configured to receive $A_4$–$A_7$, in the manner described above. Memory tile 302 is configured to receive $D_0$–$D_7$ and memory tile 1302 is configured to receive $D_8$–$D_{15}$. Note that both tiles receive $\overline{WE}$. FIG. 12 illustrates only one memory cell in each of memory tiles 302 and 1302. However, it is understood that in the described embodiment, each of memory tiles 302 and 1302 includes eight columns and sixteen rows of memory cells. Memory tile 302 has been described above in connection with FIG. 4. In addition to the previously described elements, memory tile 302 includes horizontal expansion line 1300, n-channel pass transistor 1311, p-channel pass transistor 1312 and configuration memory cell 1313. The gates of pass transistors 1311 and 1312 are coupled to configuration memory cell 1313. As a result, pass transistors 1311 and 1312 are controlled by the configuration data value stored by configuration memory cell 1313. Because pass transistors 1311 and 1312 have different conductivity types, only one of these pass transistors will be turned on at any given time. The drain of n-channel pass transistor 1311 is coupled to the output terminal of NOR gate 421. The source of n-channel pass transistor 1311 is coupled to the common node of transistors 551 and 571, to the drain of p-channel pass transistor 1312, and to horizontal expansion line 1300.

Horizontal extension line 1300 extends to memory tile 1302 (as well as to all of the other memory tiles which are horizontally adjacent to memory tile 302). Memory tile 1302, which is present in memory stripe 202, is substantially identical to memory tile 302. Thus, similar elements in memory tiles 302 and 1302 are labeled with similar reference numbers. However, NOR gate 1320, n-channel pass transistor 1321, p-channel pass transistor 1322, configuration memory cell 1323, and transistors 1351 and 1371 (which are similar to NOR gate 421, n-channel pass transistor 1311, p-channel pass transistor 1312, configuration memory cell 1313, and transistors 551 and 571, respectively) are given unique reference numbers to simplify the following discussion.

Horizontal memory expansion is accomplished as follows. Configuration memory cell 1313 is programmed to store a logic high value, and configuration memory cell 1323 is programmed to store a logic low value. As a result, n-channel pass transistor 1311 is turned on and p-channel pass transistor 1312 is turned off, thereby routing the output signal provided by NOR gate 421 to horizontal expansion line 1300 (and to the common node of transistors 551 and 571).

In addition, p-channel transistor 1322 is turned on, thereby routing the signal on horizontal expansion line 1300 to the common node of transistors 1351 and 1371. N-channel transistor 1321 is turned off, thereby isolating the output terminal of NOR gate 1320 from the common node of transistors 1351 and 1371.

As described above, the output signal provided by NOR gate 421 is routed to both the common node of transistors 551 and 571, as well as to the common node of transistors 1351 and 1371. As a result, both memory tiles 302 and 1302 are addressed in response to the address signals received by address bit selection circuits 1–4 in memory tile 302. Because both memory tiles 302 and 1302 are addressed simultaneously, the resulting memory structure has a width of 16 bits (i.e., the combined width of memory tiles 302–1302), rather than 8 bits. Note that the memory tile selection circuits 5 in memory tiles 302 and 1302 are programmed with the same configuration address, such that access to both of these memory tiles is enabled by the same configuration address.

Although only one of the sixteen rows of memory tiles 302 and 1302 is illustrated in FIG. 12, it is understood that each of the remaining fifteen rows include circuitry similar to the illustrated row. That is, each of the remaining fifteen rows include horizontal expansion lines that are similar to horizontal expansion line 1300, pass transistors that are similar to pass transistors 1311–1312 and 1321–1322, and configuration memory cells that are similar to configuration memory cells 1313 and 1323.

In one embodiment, each of the composable RAM stripes 201–216 includes the above-described circuitry to enable horizontal expansion. If all sixteen composable RAM stripes 201–216 are used, horizontal expansion can yield a word length of 128 bits (8 bits per stripe×16 stripes). Alternatively, composable RAM stripes 201–208 can be horizontally expanded to provide a first memory structure having a word length of 64 bits, while composable RAM stripes 209–216 can be horizontally expanded to provide a second memory structure having a word length of 64 bits.

Figure 13:
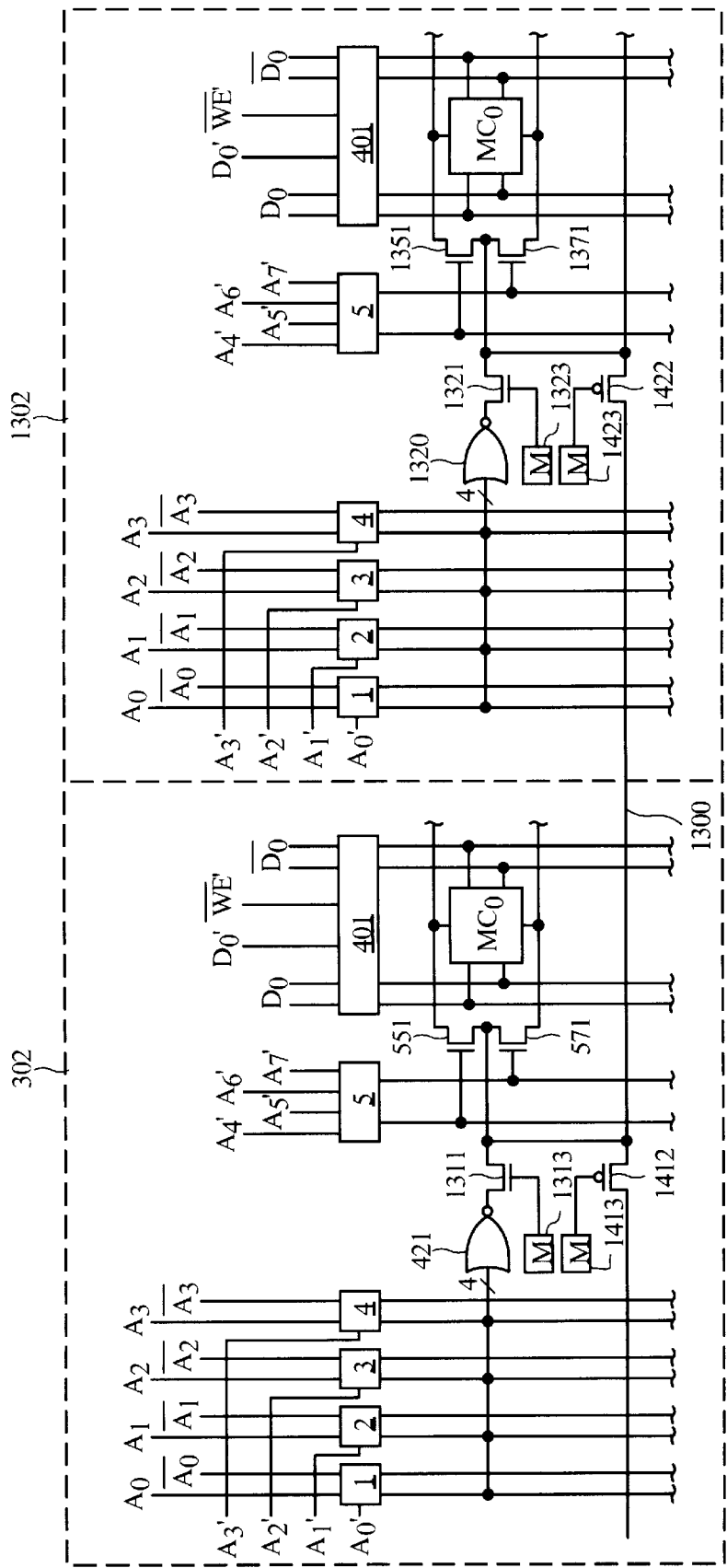
FIG. 13 is a schematic diagram illustrating portions of horizontally adjacent memory tiles which enable horizontal memory expansion in accordance with an alternative embodiment of the invention.

FIG. 13 is a schematic diagram illustrating portions of memory tiles 302 and 1302 in accordance with an alternative embodiment of the invention. Because the memory structures illustrated in FIGS. 12 and 13 are substantially identical, similar elements in FIGS. 12 and 13 are labeled with similar reference numbers. In the memory structure of FIG. 13, memory cells 1313 and 1323 are dedicated to controlling n-channel pass transistors 1311 and 1321, respectively. P-channel pass transistors 1312 and 1322 are replaced with n-channel pass transistors 1412 and 1422, respectively. Two additional configuration memory cells 1413 and 1423 are provided to control n-channel pass transistors 1412 and 1422, respectively.

The memory structure of FIG. 13 operates in the same manner as the memory structure of FIG. 12, with one notable exception. N-channel pass transistors 1311, 1321, 1412, and 1423 of FIG. 13 are independently controlled by their associated configuration memory cells 1313, 1323, 1413 and 1423. As a result, either NOR gate 421 or NOR gate 1320 can be selected to drive horizontal expansion line 1300. For example, if configuration memory cells 1313 and 1423 are programmed to store logic high values, and configuration memory cells 1413 and 1323 are programmed to store logic low values, then NOR gate 421 will drive horizontal expansion line 1300 (and the common node of transistors 1351 and 1371) in the manner previously described in connection with FIG. 12.

However, if configuration memory cells 1313 and 1423 are programmed to store logic low values, and configuration memory cells 1413 and 1323 are programmed to store logic high values, then NOR gate 1323 will drive horizontal expansion line 1300 (and the common node of transistors 551 and 571). Thus, the structure of FIG. 13 allows horizontal expansion line 1300 to be driven in two directions (i.e., from right-to-left or from left-to-right). The structure of FIG. 13 therefore, simplifies signal routing within the composable RAM array. This structure also adds some redundancy to the composable RAM array, such that even if the address bit selection circuits 1–4 of memory tile 302 are defective, horizontal expansion can be achieved by driving horizontal expansion line 1300 with NOR gate 1323.

Figure 14:
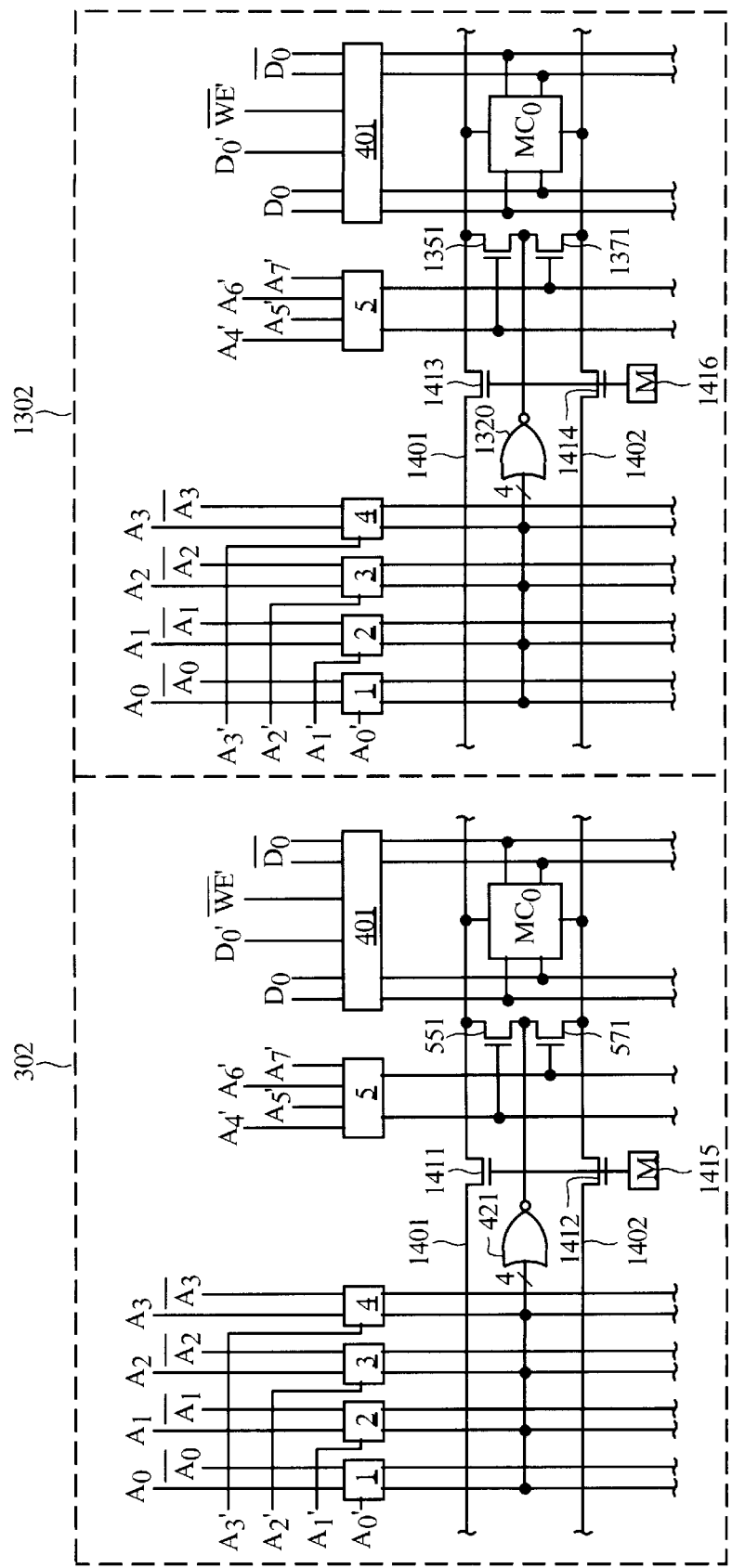
FIG. 14 is a schematic diagram illustrating portions of horizontally adjacent memory tiles which enable horizontal memory expansion in accordance with yet another embodiment of the invention.

FIG. 14 is a schematic diagram illustrating portions of memory tiles 302 and 1302 in accordance with an alternative embodiment of the invention. Because the memory structures illustrated in FIGS. 12 and 14 are similar, similar elements in FIGS. 12 and 14 are labeled with similar reference numbers. In the memory structure of FIG. 14, word lines 1401 and 1402 extend across horizontally adjacent memory tiles 302 and 1302. N-channel pass transistors 1411 and 1413 are located along word line 1401, and n-channel pass transistors 1412 and 1414 are located along word line 1402. The configuration data value stored in memory cell 1415 controls pass transistors 1411 and 1412. Similarly, the configuration data value stored in memory cell 1416 controls pass transistors 1413 and 1414.

The memory structure of FIG. 14 operates as follows. First, one of the memory tiles 302 and 1302 is selected to receive the address signals (e.g., address signals $A_0'$–$A_7'$). Even if there are more than two horizontally adjacent memory tiles, only one of these memory tiles needs to be selected to receive address signals. For example, memory tile 1302 can be selected to receive address signals $A_7'$–$A_0'$. These address signals $A_7'$–$A_0'$ have been described above in connection with FIGS. 3–8, 10–12, and 12. In this example, the memory tile selection circuit 5 in memory tile 1302 is programmed with the desired configuration address. In addition, one of the configuration memory cells 606–607 in this memory tile selection circuit 5 is programmed in the manner described above in connection with FIG. 6. In the described example, configuration memory cell 606 is programmed, thereby causing the port select line coupled to the gate of transistor 1351 to be enabled. Because configuration memory cell 607 is not programmed, the port select line coupled to the gate of transistor 1371 is disabled. As a result, when the address signals $A_7'$–$A_4'$ match the programmed configuration address, a logic high signal is applied to the gate of transistor 1351. At this time, NOR gate 1320 drives word line 1401.

Memory cell 1416 is programmed to provide a logic high signal to the gate electrodes of transistors 1413 and 1414. As a result, the signal provided by NOR gate 1320 is routed from memory tile 1302 to memory tile 302 on word line 1401. Note that word lines 1401 and 1402 are continuous between memory tiles 302 and 1302. Neither of the configuration memory cells 606–607 present in the memory tile selection circuit 5 of memory tile 302 is programmed. As a result, the gates of transistors 551 and 571 are left floating, thereby turning off transistors 551 and 571. Word lines 1401 and 1402 are thereby isolated from the output terminal of NOR gate 421. The memory cells located in memory tiles 302 and 1302 are driven by the output of NOR gate 1320. The desired data values are applied to (or read from) both memory tiles 302 and 1302.

Configuration memory cell 1415 can be programmed, thereby turning on transistors 1411 and 1412 and enabling further horizontal expansion to the left of memory tile 302. Alternatively, configuration memory cell 1415 can be unprogrammed, thereby turning off transistors 1411 and 1412, and stopping the leftward horizontal expansion at memory tile 302. Horizontal expansion can also extend to memory tiles located to the right of memory tile 1302 by programming these memory tiles in the same manner as described above for memory tile 302.

Although the invention has been described in connection with several embodiments, it is understood that this invention is not limited to the embodiments disclosed, but is capable of various modifications which would be apparent to one of ordinary skill in the art. For example, composable RAM array 102 may be formed on a semiconductor device which does not include an array of CLBs. Thus, the invention is limited only by the following claims.

What is claimed is:

1. A programmable logic device comprising:
    an array of configurable logic blocks, each of the configurable logic blocks having one or more function generators; and
    a composable random access memory (RAM) array separate from the function generators, the composable RAM array having a plurality of memory tiles, wherein each of the configurable logic blocks is coupled to a corresponding one of the memory tiles, wherein each memory tile is coupled to receive a write enable signal, address signals and data signals from a corresponding configurable logic block.

2. The programmable logic device of claim 1, wherein each of the memory tiles comprises an array of RAM cells.

3. The programmable logic device of claim 2, wherein each of the RAM cells is a single-port RAM cell.

4. The programmable logic device of claim 2, wherein each of the RAM cells is a dual-port RAM cell.

5. The programmable logic device of claim 1, wherein the composable RAM array further comprises a first stripe of serially coupled memory tiles, and a second stripe of serially coupled memory tiles.

6. The programmable logic device of claim 1, wherein each configurable logic block comprises a set of multiplexers for selectively routing data output signals provided by the corresponding memory tile or output signals provided by the configurable logic block.

7. The programmable logic device of claim 1, wherein each memory tile is configured to be selectively coupled to at least one other memory tile.

8. The programmable logic device of claim 1, further comprising circuitry for coupling adjacent memory tiles along a first axis.

9. A programmable logic device comprising:
    a composable random access memory (RAM) array having a plurality of memory tiles;
    an array of configurable logic blocks, wherein each of the configurable logic blocks is coupled to a corresponding one of the memory tiles;
    circuitry for programmably coupling adjacent memory tiles along a first axis; and
    circuitry for programmably coupling adjacent memory tiles along a second axis, perpendicular to the first axis.

10. The programmable logic device of claim 9, wherein the circuitry for coupling adjacent memory tiles comprises:
    expansion lines which extend along the second axis between memory tiles;
    pass transistors located along the expansion lines; and
    configuration memory cells for controlling the pass transistors.

11. The programmable logic device of claim 9, wherein each of the memory tiles comprises an array of RAM cells.

12. The programmable logic device of claim 11, wherein each of the RAM cells is a single-port RAM cell.

13. The programmable logic device of claim 11, wherein each of the RAM cells is a dual-port RAM cell.

14. The programmable logic device of claim 9, wherein the composable RAM array further comprises a first stripe of serially coupled memory tiles, and a second stripe of serially coupled memory tiles.

15. The programmable logic device of claim 9, wherein each configurable logic block comprises a set of multiplexers for selectively routing data output signals provided by the corresponding memory tile or output signals provided by the configurable logic block.

16. The programmable logic device of claim 9, wherein each memory tile is configured to be selectively coupled to at least one other memory tile.

17. The programmable logic device of claim 9, wherein each memory tile is coupled to receive a write enable signal, address signals and data signals from a corresponding configurable logic block.

18. A programmable logic device comprising:
    an array of configurable logic blocks, each of the configurable logic blocks having one or more function generators; and
    a composable random access memory (RAM) array separate from the function generators, the composable RAM array having a plurality of memory tiles, wherein each of the configurable logic blocks is coupled to a corresponding one of the memory tiles; and
    circuitry for coupling adjacent memory tiles along a first axis, the circuitry including:
    expansion lines which extend along the first axis between memory tiles;
    pass transistors located along the expansion lines; and
    configuration memory cells for controlling the pass transistors.

* * * * *